(12) United States Patent
Keller et al.

(10) Patent No.: US 6,441,297 B1
(45) Date of Patent: Aug. 27, 2002

(54) SOLAR CELL ARRANGEMENT

(76) Inventors: Steffen Keller, Wessenbergstrasse 19, 78462 Konstanz; Peter Fath, Hintere Lehren 1, 88798 Meersburg; Gerhard Willeke, Hegaublick 8, 78465 Konstanz, all of (DE)

( * ) Notice: Subject to any disclaimer, the term of this patent is extended or adjusted under 35 U.S.C. 154(b) by 0 days.

(21) Appl. No.: 09/623,996
(22) PCT Filed: Mar. 14, 1999
(86) PCT No.: PCT/DE99/00728
§ 371 (c)(1),
(2), (4) Date: Oct. 23, 2000
(87) PCT Pub. No.: WO99/48136
PCT Pub. Date: Sep. 23, 1999

(30) Foreign Application Priority Data

| Mar. 13, 1998 | (DE) | 198 10 904 |
| Jun. 4, 1998 | (DE) | 198 24 837 |
| Aug. 13, 1998 | (DE) | 198 36 733 |

(51) Int. Cl.$^7$ .................. H01L 27/142; H01L 31/0352; H01L 31/18
(52) U.S. Cl. ............ 136/249; 136/244; 136/256; 136/261; 257/443; 257/466; 257/465; 438/66; 438/80; 438/68; 438/81; 439/894; 439/883; 439/954; 439/890
(58) Field of Search ............... 136/249, 244, 136/256, 261; 257/443, 466, 465; 438/66, 68, 80, 81; 439/894, 883, 954, 890

(56) References Cited

U.S. PATENT DOCUMENTS

| 2,911,539 A | * 11/1959 | Tanenbaum ........... 136/249 |
| 3,330,700 A | 7/1967 | Golub et al. |
| 3,411,952 A | 11/1968 | Ross et al. |
| 3,903,427 A | 9/1975 | Pack |
| 4,129,458 A | 12/1978 | Kaplow et al. |

(List continued on next page.)

FOREIGN PATENT DOCUMENTS

| DE | 35 29 341 | 2/1987 |
| WO | WO 89/05521 | 6/1989 |
| WO | WO 89/05521 A1 * | 6/1989 |
| WO | WO 98/54763 | 12/1998 |

OTHER PUBLICATIONS

International Search Report dated Sep. 9, 1999, PCT/DE99/00728.
Energie–Direktumwandlung (Direct Energy Conversion), Dr. Karl Joachim Euler, Jul. 4, 1967, p. 55.
Emitter Wrap–Through Solar Cell, James M. Gee et al., Sandia National Laboratories, 1993, IEEE, pp. 265–270.
The Crystalline–Silicon Photovoltaic R & D Project at NREL, James M. Gee of Sandia National Laboratories and Ted F. Ciszek of National Renewable Energy Laboratory, pp. 1–7.
An Industrial Multi–Crystalline EWT Solar Cell, With Screen Printed Metallisation, A. Schonecker et al., 14th European Photovoltaic Solar Energy Conference, Barcelona, Spain, Jun. 30 to Jul. 4, 1997, pp. 796–799.

(List continued on next page.)

*Primary Examiner*—Alan Diamond
(74) *Attorney, Agent, or Firm*—Baker & Daniels

(57) ABSTRACT

The invention relates to a solar cell arrangement consisting of series-connected solar subcells. Said solar subcells consist of a semiconductor wafer which forms a common base material for all of the solar subcells and wherein a number of recesses are provided for delimiting the individual, series-connected solar subcells. The invention is characterised in that at least some of the recesses extend from the top surface of the semiconductor wafer, through the wafer itself to the bottom surface and in that at most some bridge segments are left in continuation of the recesses as far as the wafer edge, to mechanically interconnect the solar subcells.

27 Claims, 27 Drawing Sheets

U.S. PATENT DOCUMENTS

| | | |
|---|---|---|
| 4,144,096 A | 3/1979 | Wada et al. |
| 4,179,318 A | 12/1979 | Kaplow et al. |
| 4,283,589 A | 8/1981 | Kaplow et al. ............. 136/249 |
| 4,300,680 A | 11/1981 | Champlin ................... 206/427 |
| 4,352,948 A | 10/1982 | Kaplow et al. ............. 136/249 |
| 4,376,872 A | 3/1983 | Evans et al. ................ 136/249 |
| 4,612,408 A | 9/1986 | Moddel et al. ............. 136/244 |
| 4,808,904 A * | 2/1989 | Ricaud et al. .............. 320/101 |
| 4,877,460 A * | 10/1989 | Flodl ......................... 136/244 |
| 5,024,953 A | 6/1991 | Uematsu et al. |
| 5,067,985 A | 11/1991 | Carver et al. ............... 136/255 |
| 5,128,736 A * | 7/1992 | Yoshida et al. ............. 136/244 |
| 5,164,019 A | 11/1992 | Sinton ........................ 136/249 |
| 5,330,918 A * | 7/1994 | Dubbleday et al. ......... 136/249 |
| 5,391,236 A | 2/1995 | Krut et al. ................... 136/249 |
| 5,538,902 A * | 7/1996 | Izu et al. ...................... 438/66 |
| 5,641,362 A | 6/1997 | Meier ......................... 136/256 |
| 5,704,992 A | 1/1998 | Willeke et al. ............. 136/255 |

OTHER PUBLICATIONS

Advances in Thin Film PV–Technologies, H.A.. Aulich, 13th European Photovoltaic Solar Energy Conference, Nice, France, Oct. 23–27, 1995, pp. 1441–1444.

High–Efficiency (19.2%) Silicon Thin–Film Solar Cells with Interdigitated Emitter and Base Front–Contacts, C. Hebling et al., 14th European Photovoltaic Solar Energy Conference, Barcelona, Spain, Jun. 30–Jul. 4, 1997, pp. 2318–2323.

Silicon Solar Cells, Avanced Principles and Practice, Martin A. Green, Mar. 1995, pp. 238–263.

* cited by examiner

Fig.13
f) 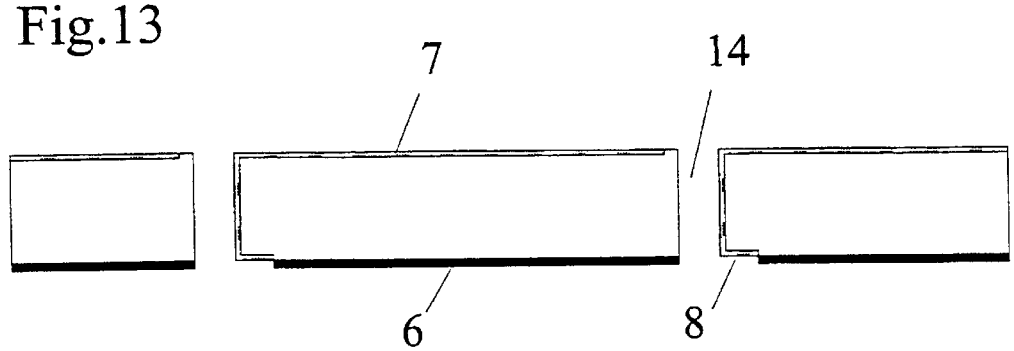
g) 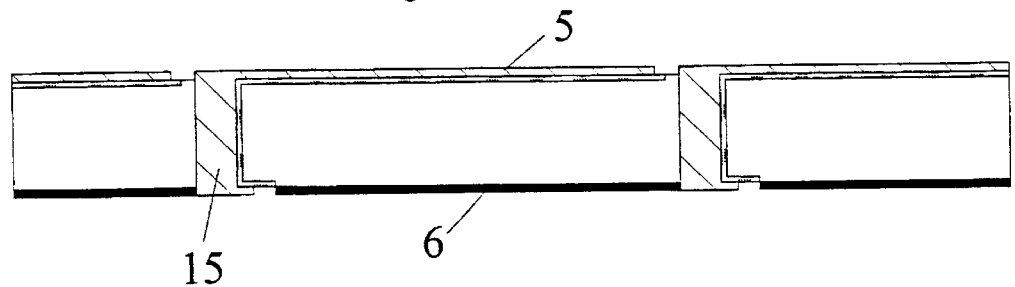
h) 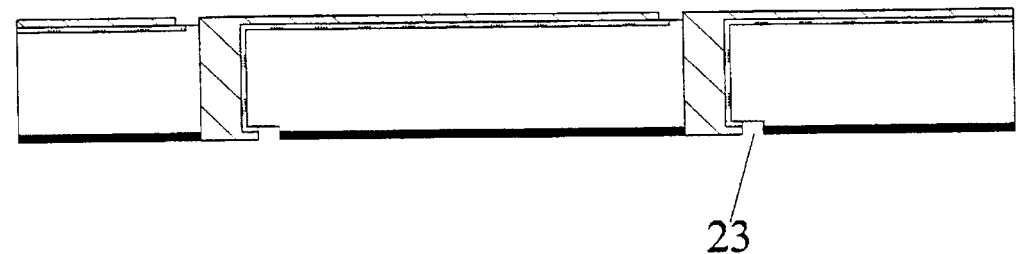

SOLAR CELL ARRANGEMENT

The invention relates to a method and a device according to the respective characterizing portions of the independent claims. Accordingly, the invention relates to a solar cell arrangement.

Solar cell arrangements find a wide variety of applications. Large-surfaced solar cell arrangements are used in photo-voltaic systems, for example, which can provide sufficient energy for consumers with a higher demand. In this case, the costs of the cells often play a subordinated role because they are not significant compared to the costs required for a connection to a public supply system, or because there is no useful alternative, as in the case of aerospace applications.

Solar cell arrangements are also used in a variety of small devices, currently having a low output, such as pocket calculators and wristwatches. However, in principle, it is also feasible to use solar cell arrangements in electronic consumer goods appliances having a slightly higher energy requirement than a pocket calculator or a watch. For example, solar cell arrangements could be considered for charging and operating portable computers and cell phones independent of the network where the operating voltage usually ranges between 6 and 12 V.

Technically, this is feasible, because a cell phone battery, for example, which provides approx. 2 Watts for a call, requires a charging voltage of approx. 7 Volt and a total charge of approx. 550 mAh to 1200 mAh. In order to keep the cell phone functional merely by means of insolation a surface of approx. 50 $cm^2$ is available on the rear.

With solar cell arrangements based on silicon technology having said surface and assuming an efficiency of only approx. 14% and small series connection losses a voltage of more than approx. 7 Volt and currents of more than 100 mA at the maximum power point are achievable so that it is possible, in principle, to achieve a charge by means of insolation of sufficient duration.

The cells to be installed, however, should not affect the size or compactness, nor should they be too expensive in order to be used in consumer products. To meet the first requirement relatively small solar cells of a few square centimeters have to be connected which requires very small modules instead of the large-surfaced solar cell modules commonly used in photo-voltaic systems. These must be mounted so as to be cost-effective.

Previously, the use of solar cell arrangements often failed because the costs were too high. This was also due to the high costs of series connection. In principle, in series connection the base of the first cell has to be connected conductive with the emitter of the second cell. Typically, the base is arranged on one solar cell surface, the emitter on the opposite surface.

When solar cells on the basis of crystalline silicon wafers are used for solar cell arrangements there are several options, in principle, according to the state of the art to achieve the series connection. For example, the cell front surface of a solar cell can be connected electrically conductive with the rear surface of the following cell via tin-coated copper strips or the like. Further, it is known in the art from "Direct Conversion of Energy" by K. J. Euler, Karl Thiemig KG Publishers, Munich, 1967, page 55, to arrange the individual solar cells slightly overlapping in the manner of shingles or roof tiles and then to electrically connect the base rear contact of one cell with the emitter front contact on the following cell. From the article "Emitter Wrap-Through Solar Cell" by J. M. Gee et al., Proc. $23^{rd}$ IEEE PVSC, Louisville, 1993, pages 265–270, it is known to provide a solar cell with front and rear emitter of the n+type which encompasses a p-doped base material. While the emitter on the front has to be provided only with an anti-reflex coating two contact grids are provided on the rear, one of the p-type for contacting the base and one of the n-type for contacting the emitter, respectively. Both grids form a pattern of interlinked fingers connected at one end via so-called bus bars. In order to connect the emitter on the front with the emitter on the rear or with the emitter contact grid provided there, holes are made in the substrate by means of laser pulses, which are then doped and filled with metal using a selective method so as to produce a conductive connection. While the publication discusses the series resistance of an individual element, it does not specify how multiple cells can easily be connected.

It was further proposed in an article published in the Internet entitled "The crystalline-silicon photo-voltaic R&D Project at NREL and SNL" by J. M. Gee and T. F. Ciszek at http://www.sandia.gov, to provide a module assembly concept where all cells of a module are encapsulated and electrically connected in one single step. For this purpose, the cells are contacted on the rear where a rear module surface plane includes both the electrical circuit and the encapsulation material in one single piece, and a one step method is provided for arranging said components into a module.

For this purpose, the cells contacted on the rear are placed on a plane base having a pre-formed electric connecting pattern and deposited on the rear surface beyond said base. This requires handling individual cells, which is problematic in the above mentioned applications because of the size of the cells.

The article "An industrial multi-crystalline ewt solar cell with screen printed metallization" by A. Schönecker et al., $14^{th}$ European Photo-voltaic Solar Energy Conference, Barcelona, 1997, pages 796 and following, specifies connecting a number of cells in that they are contacted via bus bars, for example using the above described emitter-wrap-through technology, and subsequently connecting the bus bars of the individual modules via electrical conductors. The article does not specify how the individual modules should be handled.

The article "Advances in thin film PV technologies" by H. A. Aulich, $13^{th}$ European Photo-voltaic Solar Energy Conference, Nice, France, Oct. 23 to 27, 1995, pages 1441 and following specifies a number of different thin film solar modules consisting primarily of materials other than silicon. Also, the use of amorphous silicon is described where reference is made to the so-called photo degradation, i.e. a deterioration in the effectiveness over time.

A further method of contacting is known from the article "High efficiency (19.2%) silicon thin-film solar cells with interdigitated emitter and base front-contacts" by C. Hebling et al., $14^{th}$ European Photo-voltaic Solar Energy Conference, Barcelona, Spain, Jun. 30 to Jul. 4, 1997.

It proposes a so-called SOI structure, i.e. "silicon on insulator structure" where the actual cell is applied to an insulating layer. The described method is comparatively expensive, however.

From the book "Silicon solar cells—advanced principles and practice" by Martin A. Green, ISBN 0 7334 09946, published by the Center for photo-voltaic devices and systems, University of New South Wales, Sydney, NSW 2052 in March 1995, solar cells with a so-called buried structure are known, where grooves are made in the material by means of a laser, mechanical cutting wheels or other mechanical or chemical means, and the grooves are chemically cleaned. Subsequently, a strong doping agent is applied and the grooves are filled with metal. Contacts are obtained thus after taking further steps. The book also mentions the above mentioned finger-like cells contacted on the rear as well as point contacted solar cells where, instead of a p-conductive bus bar, p-conductive contact points are distributed over the cell so as to better determine certain cell properties.

From the U.S. Pat. No. 4,612,408, an interconnected solar cell array is known which is produced in that a number of the arrangements are formed on the semiconductor surface, grooves are formed in the surface which, in part, extend into the substrate, an oxide layer is formed on selected sections of one surface and on the surfaces of the grooves, the grooves are filled with an insulating material, metal connections are produced between adjacent components extending over the grooves and the insulating material, an insulating support is mounted on one surface and then a separation beginning at the other surface side through the wafer into the grooves so as to separate the adjacent arrangements while the metal connections remain. Such a separation is problematic.

The U.S. Pat. No. 4,300,680 describes a series of strip-shaped semiconductor connections arranged on one of the two surfaces as a semiconductor substrate having a high ohmic resistance, where said connections alternately have p+ and n+ conductive characteristics and are parallel with respect to each other and are interspaced at intervals in such a way that a semiconductor connection having a p+ conductivity characteristic on a surface of the semiconductor substrate is always opposite a semiconductor connection having an n+ conductivity characteristic on the other surface, and printed strip conductors are arranged alternately on one and the other surface of the semiconductor substrate where said strip conductors always connect a row of solar cell connections with an adjacent row.

The U.S. Pat. No. 5,391,326 describes a photo-voltaic solar cell array which is produced monolithic without a supporting substrate in that a system of channels is formed of one side of a substrate so as to define separate cell surfaces, the channels are filled with an insulating filler material adhering to the substrate material and providing it with structural integrity, and then channels are provided from the opposite side of the substrate so as to provide an air gap isolation system between adjacent cells. Series connections between adjacent cells are provided in that the front surface of a cell is connected via the filler material with the volume semiconductor for the following cell where the connection is provided through the volume semiconductor itself to the rear electrodes of each cell. Said contacting provides only a small contacting surface resulting in high intermediate resistances. Furthermore, the filler material used is polyimide and represents a significant cost factor in the production.

The U.S. Pat. No. 5,164,019 describes an array of series-connected cells formed in a monolithic semiconductor substrate which are electrically insulated from each other in that grooves extending partially through the substrate are formed in a first surface between cells and the substrate is then broken by the bottom of the grooves to an opposite main surface. A metallization connecting the cells provides the physical integrity of the cell field after breaking the substrate. The grooves can be formed before or after the production of the cells is completed. It is problematic that the braking of the cells has to be defined and the mechanical stability is ensured only by metal contacts which are typically thin.

The U.S. Pat. No. 5,024,953 describes an opto-electrically transmitting element and a method for producing the same using a corrugated semiconductor substrate so as to produce an opto-electronically transmitting element. The element has a reduced effective thickness and an improved opto-electronic conversion efficiency while its mechanical stability remains intact. A form is provided therefor having a zigzag or a meandering shape in profile where said wavy or corrugated structures are continuous.

DE 44 263 47 specifies a flat component having a grid of through-holes where said through-holes are produced in that on both the front and rear of a disc-shaped circular body a number of preferably equidistant, parallel, particularly V-shaped channels are formed where the channels of both sides are at an angle relative to each other and have a depth so as to produce through-holes on the intersecting points of the channels. DE 44 263 47 is primarily concerned with the question of how such grids can be produced. It proposes using as a compensating material, for example, mono-crystalline silicon disc wafers cut from cast silicon blocks, multi-crystalline silicon strips produced by means of precipitation from a silicon melt on a graphite network, etc. The above document discusses contacting the respective solar cells, but does not indicate how the used voltage can easily be increased by means of interconnecting multiple solar cells.

A solar cell panel is known from the U.S. Pat. No. 3,330,700 having a base structure that includes a metal substrate, an insulating layer on top of the substrate and a coating of adhering material on top of the insulating layer where a field of four solar cell rows is arranged parallel on the coating of adhering material and the cells are arranged such that the p-layers of a row of cells are adjacent to the n-layers of the following row of cells. The cells are isolated and completely separated from each other and are connected via metal strips.

The U.S. Pat. No. 3,903,427 proposes a method for connecting and contacting so as to reduce the loss of power in the solar cell. Accordingly, a solar cell is produced from a semiconductor wafer where the light-sensitive semiconductor material has a top and a bottom surface. Holes are extending through the semiconductor wafer from the top to the bottom thereby producing an electrical contact from the top to the bottom where the contact leading down from the top is electrically insulated against the contact on the bottom so as to allow collecting the current. However, it is not specified how a particularly favorable series connection can be produced particularly advantageously.

A further solar cell arrangement is known from the U.S. Pat. No. 3,411,952 where a number of solar cells are arranged and soldered to metal strips. By appropriately selecting the length and width of said metal strips on which the individual solar cell modules are placed the desired voltage is generated in accordance with the U.S. Pat. No. 3,411,952.

The U.S. Pat. No. 4,129,458 describes a solar cell arrangement consisting of multiple interspaced longish unit cells of a field from a single wafer which is longitudinally grooved and consisting of a substrate material of a first conductivity type, having adjacent side walls of adjacent units at each groove formed between units. Transversely in such groove formations, the side walls of every second groove are formed having areas of a second conductivity type so as to result in only one connection between the first and second conductivity types at or near the surface of each unit which is exposed to the radiation.

According to a general form, the grooves extend over the full distance between the top and bottom wafer surfaces while forming discrete one-cell units. According to another general form, every second groove ends near, but before the top surface, so as to define discrete double cell units. The units are series-connected in that ohmic connections between the area of the second conductivity type of one unit and the area of the first conductivity type of an adjacent unit are produced. This is intended to allow a comparatively simple and economical production. This cell arrangement is intended to build a better solar cell field from a single piece of substrate material where the individual units of the field remain in precisely the same positional relationship as in the individual original piece. According to the U.S. Pat. No. 4,129,458, the grooves or gaps between the units can be filled with insulating material, or they remain partially or fully open, while a support is used to provide the relative alignment. With regard to forming the grooves, it is merely proposed that they should not fully extend continuously from one surface to the opposite one. Thus, connections extending over the full length of the adjacent side may remain.

The U.S. Pat. No. 4,179,318 having the same author as the above mentioned U.S. Pat. No. 4,129,458, also describes a solar cell arrangement. Again, the groove formation described therein does not differ from the one described in U.S. Pat. No. 4,129,458.

A further arrangement of a semiconductor solar cell is known from the U.S. Pat. No. 4,283,589 which, for increasing the efficiency of a solar cell, proposes to provide a substrate body with a number of laterally interspaced longish grooves having opposing slanting side walls diverging in a certain way.

The grooves in the semiconductor substrate are also provided so as to allow a certain solar cell field connection. In an exemplary embodiment shown in the U.S. Pat. No. 4,283,589, cell units are formed from a single source substrate provided with grooves via which adjacent cell units are spaced apart by a predetermined width. The grooves extend fully through the semiconductor wafer and the mechanical integrity is provided either by means of filling the grooves with a suitable material or by means of a supporting oxide layer extending below the groove.

A further solar cell is known from the U.S. Pat. No. 4,352,948 where grooves are provided. Among other things, it is proposed that the grooves provided in a single wafer have the same length and end shortly before the opposite sides. However, the individual grooves do not extend through the material over its full depth.

The U.S. Pat. No. 4,376,872 specifies a solar cell having a number of discrete voltage-generating areas which are formed from a single semiconductor wafer and are interconnected in such a way that the voltages of the individual cells will sum up. The unit cells include doped areas of opposite conductivity types separated by a gap. Said known solar cells are produced in that V-shaped grooves are formed in the wafer and the wafer is subsequently aligned such that ions of one conductivity type can be implanted on one side of the groove while the other side is screened.

A metallizing coat is applied and selectively etched away so as to provide connections between the unit cells.

A solar cell is known from the U.S. Pat. No. 5,067,985 using an anisotropic etched silicon crystal wafer oriented in a certain way. The solar cell structure includes top edges between cell channel walls so as to improve the ability to capture the light. However, the publication does not discuss the question of how solar cell units can be produced from a single waver and connected so as to obtain a higher voltage.

A further solar cell arrangement is known from the U.S. Pat. No. 5,641,362 using a certain contacting system so as to provide a cost-effective solar cell arrangement. Accordingly, two contact patterns each consisting of parallel strips which are connected to form a bus bar on one end are . . . on the rear of the solar cell [sentence incomplete]. The wafer is uniform, however, except for some possible superficial modifications.

From DE 35 29 341 A1 a solar cell module is known having multiple single cells arranged on a support body and connected electrically conductive where said support body is equal in area to the single cells, including the separation slits between them. The contacts on the rear of the solar cells are connected electrically conductive with associated connection contact surfaces on the rear of the support body via contacts in the support body. A suitable support body, for example, is a glass fiber reinforced synthetic material having a thickness of 0.3 mm. A connecting contact is provided on the support body and a large surfaced solar cell is soldered thereto which is equal in area to the whole of the support body.

Subsequently, the semiconductor disc mounted on the support body is divided by means of separating cuts so as to prevent the necessity for handling each individual cell separately. The use and the complex configuration of the support body, however, are undesirable, because they are cost-intensive.

WO 89/05521 specifies a solar cell arrangement consisting of a number of interconnected solar cell matrices. Each matrix includes a number of series-connected solar cells of the emitter-wrap-through type. This arrangement is intended to prevent the solar cells from being damaged, particularly in aerospace applications. It is proposed to produce each solar cell matrix from a single wafer on which a pn-junction and a number of front and rear contacts are formed before the wafer is placed on a masking glass and divided into a number of individual solar cells. Again, the disadvantage is the required masking glass.

The preceding WO 98/54763 specifies a solar cell in a semiconductor substrate where a certain contacting method is prescribed, but it does not propose dividing a larger semiconductor into a number of individual sections.

The object of the invention compared to the above discussed prior art is to provide a new solar cell arrangement for industrial application, particularly, but not solely, for obtaining a series-connected solar cell permitting a cost-effective production.

The independent claims specify how the aim of this invention can be achieved. Preferred embodiments are found in the sub-claims.

Therefore, the first fundamental principle of the invention is to provide a solar cell arrangement of series-connected solar sub-cells consisting of a semiconductor wafer that forms a common base material for all solar sub-cells and wherein a number of recesses is provided for delimiting the individual series-connected solar sub-cells where at least some of the recesses extend from the top surface of the semiconductor wafer to its bottom surface through the wafer itself and in that at most some bridge segments are left in continuation of the recesses as far as the wafer edge so as to mechanically interconnect the solar sub-cells.

Said bridge segments achieve that the respective solar sub-cells are adequately electrically separated but still having a mechanical cohesion that allows that the solar cell arrangement can be handled as a single piece of material. Using a few bridge segments allows a considerably better insulation of the sub-cells with a considerably better stability. "Quasi-short circuits" occur only localized and are not distributed over the full length of the sub-cell. Also, with the bridge segments the use of an expensive filler material, such as polyimide, is easily eliminated and they can be configured so narrow that the electrical properties of the solar cell arrangement are minimally affected, if at all. Thus, it is proposed to use a crystalline semiconductor waver, preferably consisting of silicon, for producing all cells in the solar arrangement while the sub-cells are electrically insulated by means of partially thinning the wafer.

In accordance with the invention, partially thinning means that the semiconductor material is fully removed between two sub-cells so that at most some bridge segments remain and thus narrow, long holes or slits, respectively, are made in the wafer.

If on one side of the solar sub-cells one finger grid is provided each for the emitter and the base, it is preferable to arrange a bus bar on the finger grid for emitter and base such that two adjacent solar sub-cells are electrically connected via a common bus bar. Said bus bar may run over the bridge segments.

In the area of the bridge segments an insulating material, particularly an oxide coating, can be provided on the semiconductor material of the wafer, firmly bonded with the latter, and a strip conductor is provided on top of the insulating layer.

The solar cell arrangement can have solar sub-cells with at least two varying areas where particularly the sub-cells arranged on the edge differ in area from the sub-cells in the center. The result of such a configuration is an increase in the efficiency of the overall arrangement. This is because of an incomplete insulation of the sub-cells causing a physical asymmetry. Said asymmetry, in turn, causes the individual sub-cells to operate at different operating points, which means that unlike common modules, where the size of the individual cells should be as uniform as possible, a variation in the size of the individual sub-cells may increase the efficiency. It can be demonstrated that the cell located at the wafer edge and representing the negative pole of the solar cell arrangement should be decreased in area compared to the remaining sub-cells.

The selected area ratio depends on the quality of the insulation between the sub-cells and the selected geometry of the solar cell arrangement. The better the insulation the less the sub-cell areas should differ.

In a particularly preferred embodiment of the solar cell arrangement the bridge segments for the contact are designed to have an external component unit and/or forming a part of a contact element which is mounted laterally before the wafer is cut. This allows in the most consistent manner to completely sever the waver and to externally mount the bridge segments by means of a laterally mounted connection strip as an external component unit or by means of a carrier substrate.

It is also shown how the solar cell arrangement can be produced from series-connected solar sub-cells in that the recesses are produced by means of a waver cutter, with the use of a laser, by means of wire cutters, etching methods, sandblasting, water torches, ultrasound treatment, or a combination thereof.

The recesses can be produced particularly by means of a wafer cutter in that it is lowered stepwise to the wafer and moved across the latter, where the wafer cutter preferably is lowered to the wafer at a first site, moved across the wafer to where the bridge segment begins, moved across the waver at least once along the groove with a given lowering factor, and subsequently it is lowered further and moved again. This allows that the bridge segments are easily produced without a significant risk of breaking. It can also be provided for a wafer cutter to be lowered to the waver controlled and/or regulated preferably under rapid rotation, moving it through the depth of the wafer and then transversely across the wafer.

When the solar cell arrangement consisting of series-connected solar sub-cells is provided with a contact bank on the lateral wafer edge the bridge segments can be encompassed by said contact bank. The contact bank can be provided with metal bows that produce an electrical connection from one of the sub-cell rear contacts to the front contact of another sub-cell and thus permit a series-connection of the sub-cells and comprising recesses through which the separating tools can be guided.

Another option of obtaining the ability to handle and insulate series-connected solar sub-cells is to arrange a semiconductor wafer on a carrier substrate and subsequently providing it with continuous cuts for producing and insulating the sub-cells. The carrier substrate can be designed for externally connecting the solar-sub-cells and/or it can be provided with channels through which the separating tools can be guided for forming continuous recesses through the wafer without damaging the carrier substrate.

BRIEF DESCRIPTION OF THE DRAWINGS

The invention will be described below by means of examples only with reference to the drawings, as follows.

In the figures, identical reference numbers are referring to identical or similar components. Reference No. 1 is used for the wafer. In addition, the following reference numbers are used: 2 for the solar sub-cell; 3 for a rear channel, 4 for an indentation, 5 for an emitter contact finger, 6 for a base contact metallization, 7 for a front emitter, 8 for a rear emitter; 9 for an emitter contact metallization, 10 for a dielectric or insulating coating (nitride coating), 12 for a connecting area, 13 for a hole, 14 for a cutting area, 15 for a contact connection, 16 for a carrier substrate or a (carrier board), 17 for a conductor strip, 18 for soldering material, 19 for a substrate channel, 20 for a contact bow, 21 for a bracket, 22 for a strip housing, 23 for a recess, and 24 for an etching-resistant lacquer 24.

Figure 1:
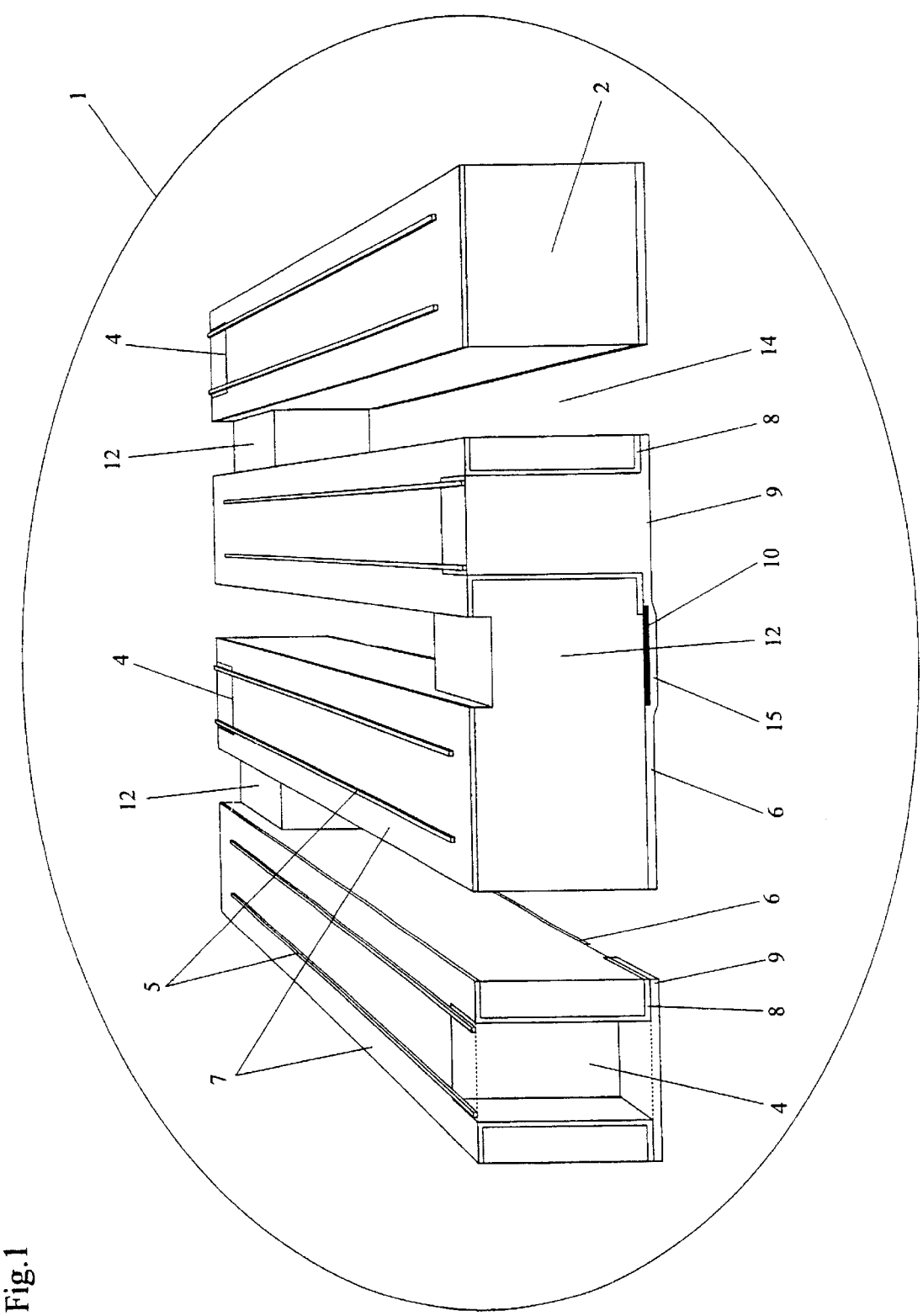
FIG. 1 a section of the front of a solar cell arrangement micro module with a monolithic circuit via indentations in the wafer edge.
Figure 2:
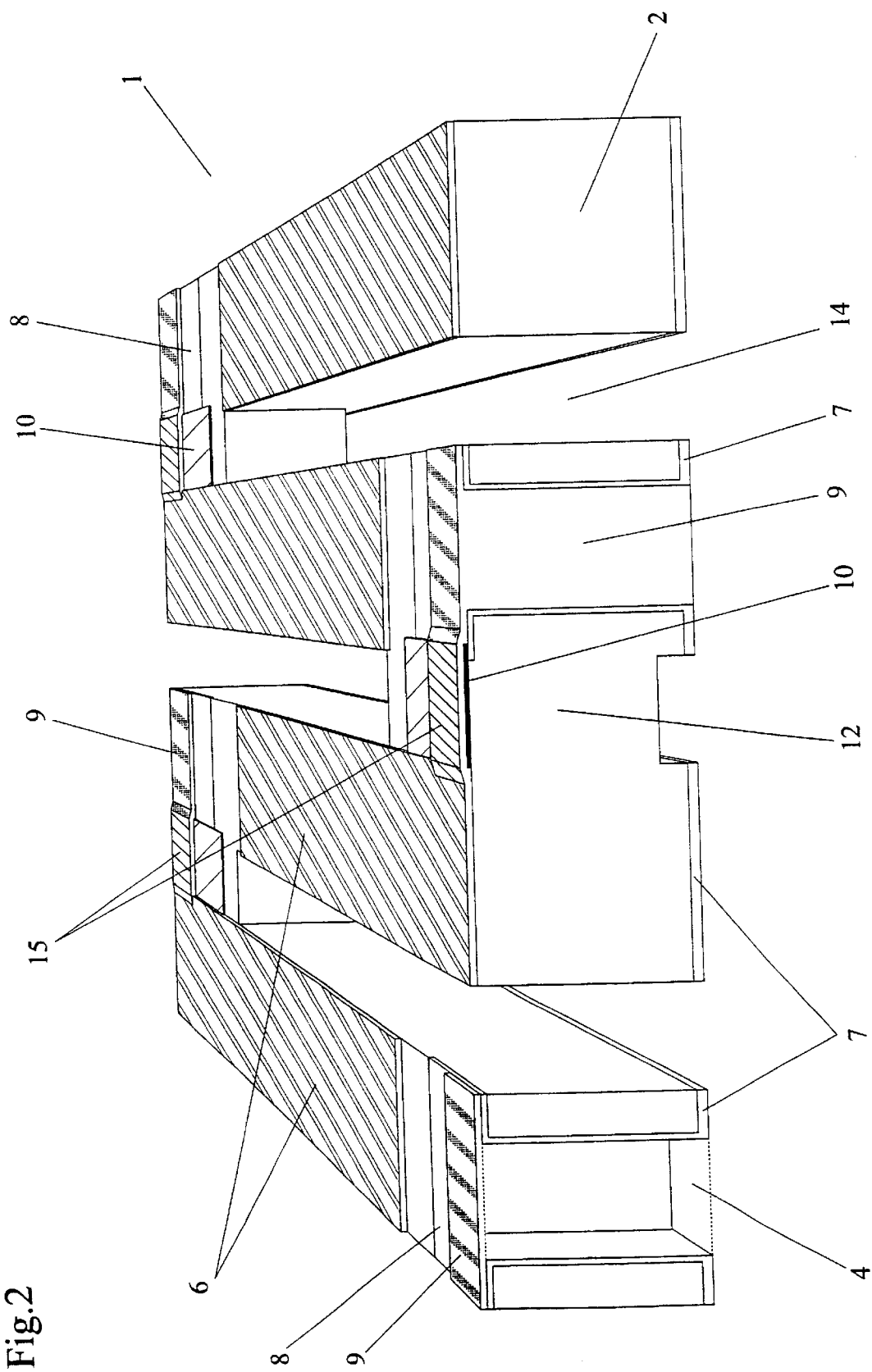
FIG. 2 a section of the rear of the solar cell arrangement micro module of FIG. 1.

FIGS. 1 and 2 illustrate a first exemplary embodiment of the invention where cuts 14 are made in a wafer 1 from two opposite wafer edges, thereby producing a meandering strip of sub-cells 2 whose front emitters 7 are separated.

A small area on the rear of each sub-cell is provided with an emitter (rear emitter 8). The front emitter 7 is connected with the rear emitter 8 via indentations 4 on the wafer edge, which are also provided with an emitter coating.

Both the bare cell bases on the rear and the rear emitter areas 8 are metallized spatially separated where, by means of short bus bars, i.e. contact connections 15 across the remaining connecting areas 12, adjacent sub-cells 2 are series-connected so as to allow a monolithic circuit for the sub-cells 2.

The rear bus bar (contact connection 15) is mounted by means of a screen printing paste. The paste also fills the indentations 4 on the wafer edge. The metal filling the indentations 4 forms an electrical connection between the emitter contact finger 5 on the front of the cell and the base metallization 6 of the adjacent sub-cell and thus ensures that the series resistance losses are minor.

The contact connection 15 extends over an insulating coating 10 which is arranged so as to prevent a short circuit between the rear emitter 8 of a sub-cell and the cell base of the same sub-cell while, on the other hand, the distance between the rear emitter 8 of a sub-cell and the base contact metallization 6 of the adjacent sub-cell increases.

Figure 3:
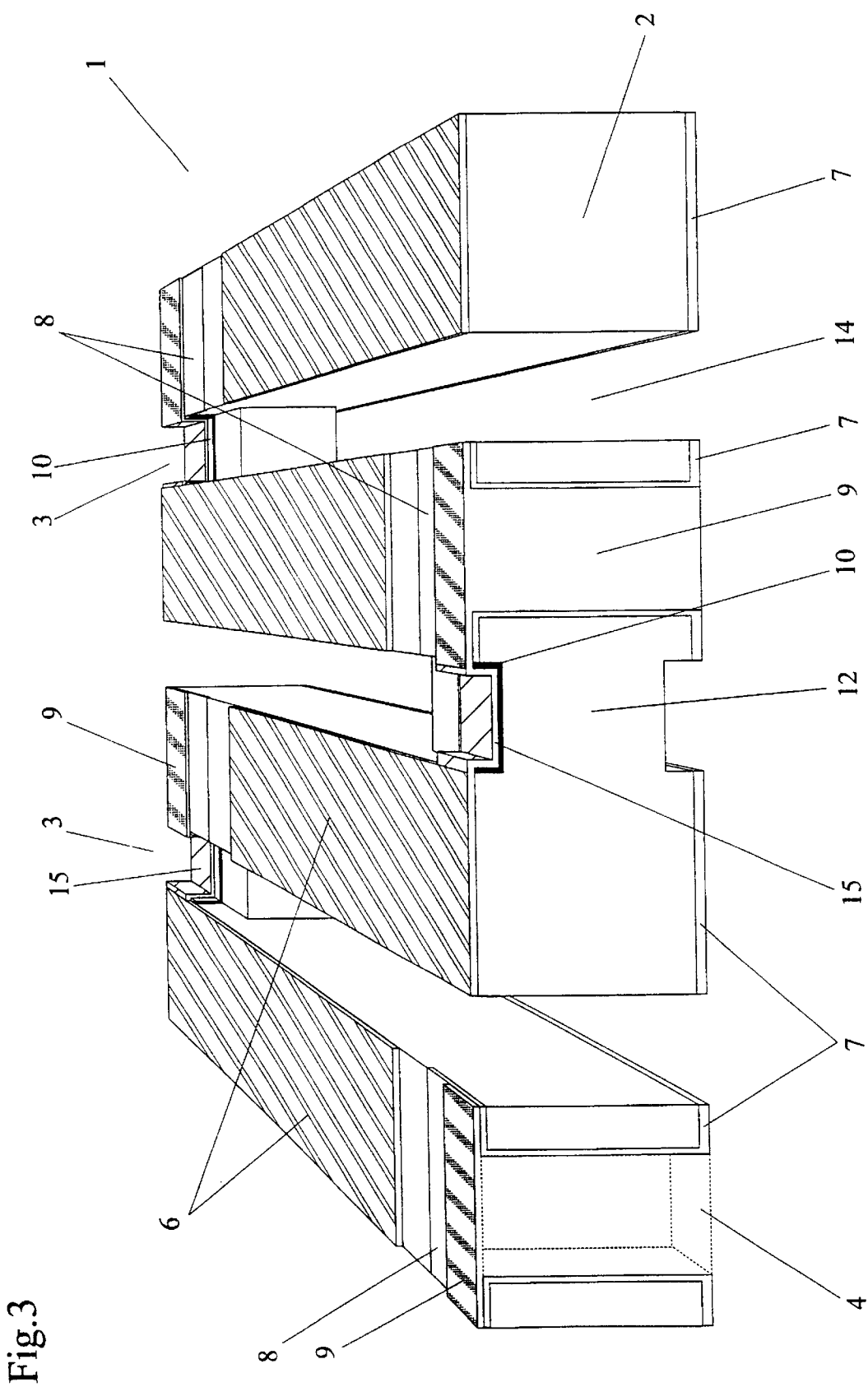
FIG. 3 a section of the rear of another solar cell arrangement micro module where the circuit was produced via indentations in the wafer edge and continuous channels on the rear.

FIG. 3 shows that a rear channel 3 can be provided optionally in the connecting area 12 which takes into account that the processes where, after producing an electron/hole pair, the electron reaches the emitter, while the hole reaches the base contact of the adjacent sub-cell, represent a loss mechanism, which is the reason why the distance from the emitter to the base contact of the adjacent sub-cell should also be configured as large as possible.

Figure 11:
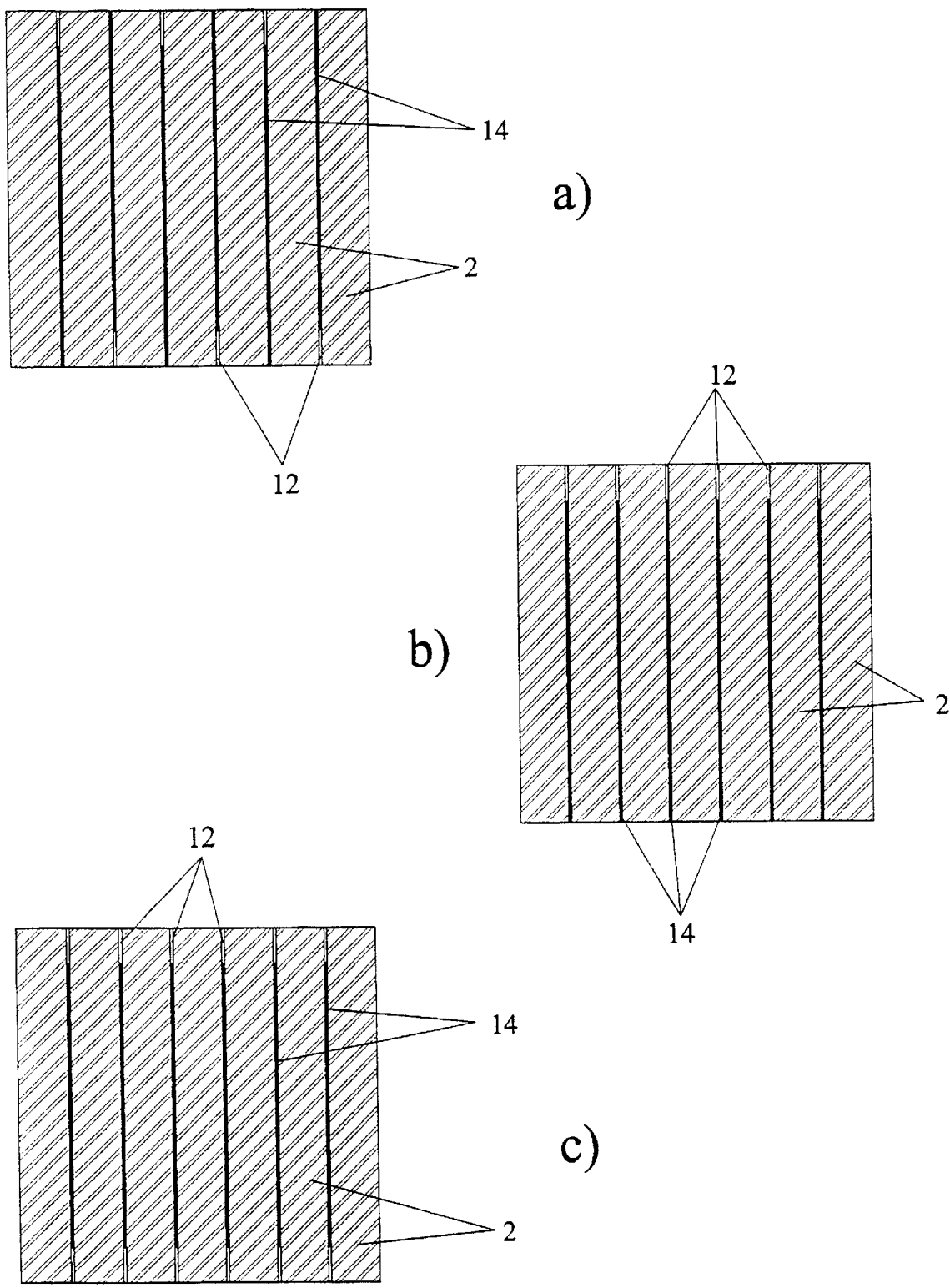
FIGS. 11a–f) various cell geometries as seen from top, where individual details of the solar cell arrangement micro module, such as contact fingers and bus bars, are not included.
Figure 11:
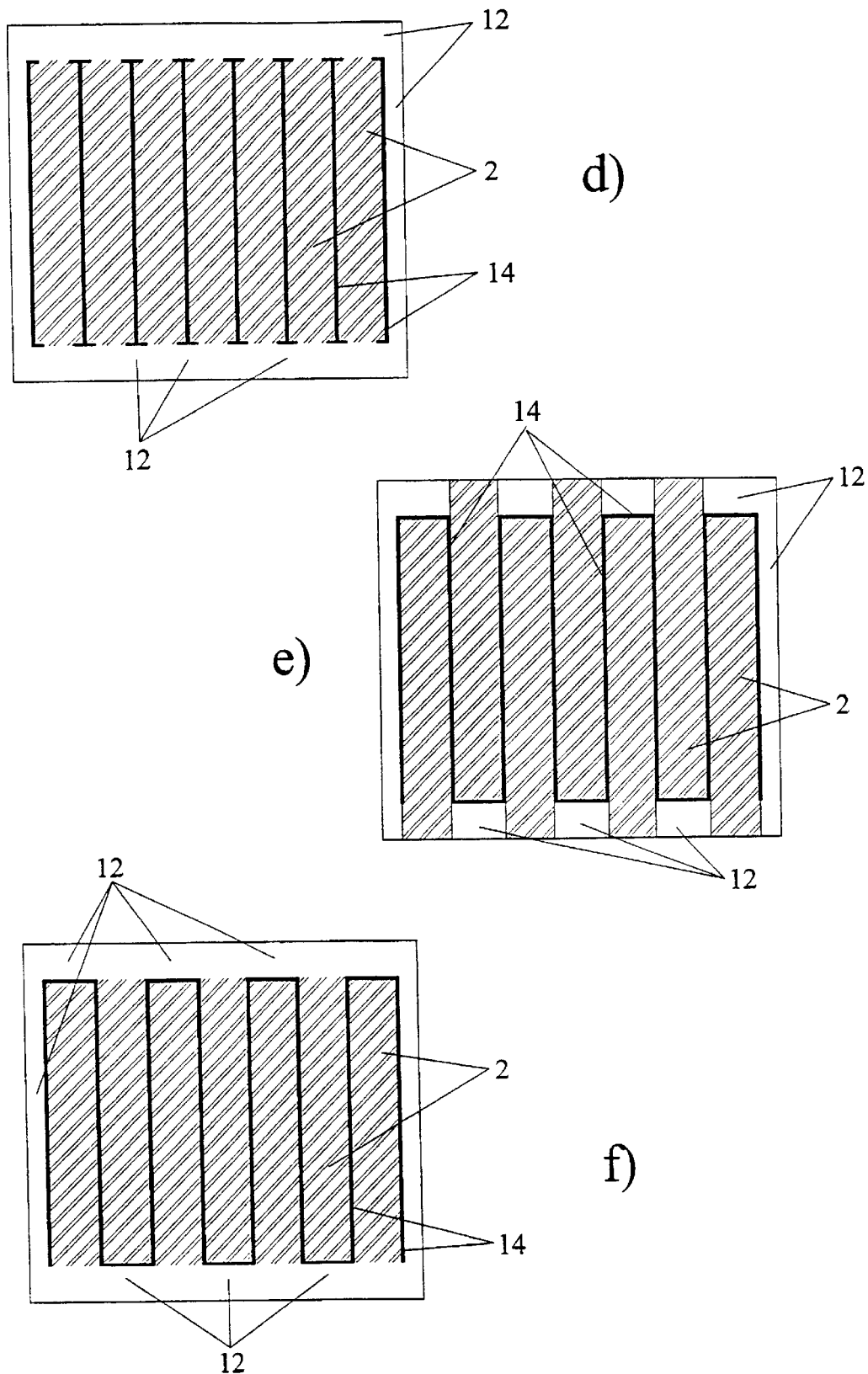

The meandering micro module, i.e. the solar cell arrangement geometry presented here is advantageous because it allows a simple series connection of two sub-cells by means of a common bus bar (contact connection 15) across the remaining connecting areas 12. A comb-shaped geometry or arrangement having multiple bridge segments (connecting areas 12) between two sub-cells is also feasible, however. Reference is made to FIG. 11 where the micro module geometries are shown as seen from top. Individual details of the solar cell arrangement micro module, such as contact fingers and bus bars, are not shown. The thick black lines represent the cuts 14 extending through the waver while the hatched areas designate the actual sub-cells 2. The white areas represent the bridge segments 12. When adjacent bridge segments 12 are directly abutting, as in the geometries according to d) and f), this will result in a frame on which the bus bars connecting the sub-cells may be provided. As a result of the increase in the distance between the sub-cells, or the extension of the connecting bridge segments 12, respectively, the geometries d)–f) provide an increased sub-cell insulation compared to the geometries according to a)–c).

A possible process sequence for producing the solar cell arrangement micro module of the invention (FIGS. 1 and 2) will be described in more detail below.

Crystalline silicon disks may serve as the starting material for the production process. Whether mono, multi or polycrystalline wafers are used depends on the desired efficiency and the costs of the material. For the basic function of the solar cell arrangement micro module the crystallinity of the material is of secondary importance. The following is based on the assumption of a p-doped wafer although n-type wafers could also be used.

1. First, a polishing defect etching step takes place where a surface layer of approx. 10–20 μm is removed so as to remove the surface defects which may have occurred when the wafer was separated from the ingot. Alkaline solutions (NaOH, for example), acid mixtures and dry etching methods can be used therefor.

2. Thereafter, an insulating coating, such as a nitride, particularly a silicon nitride coating, $Si_3N_4$, is applied to the rear and serves as a barrier for a subsequent emitter diffusion. Along one wafer edge, on every second sub-cell 2, an edge strip having a depth of a few millimeters and the width of the sub-cell to be created is protected against the nitride. The same applies to the opposite wafer edge, however, the uncovered spaces are offset by one sub-cell 2. (The edge strips correspond to the subsequent rear emitter areas 8 in FIG. 2.) Before producing an insulating or nitride coating said cell areas can be protected, for example, by means of a mask during a directional PECVD (plasma enhanced chemical vapor deposition) nitride deposition.

3. In the third process step an indentation 4 is made on one face of a sub-cell 2 via which the waver edge is locally shifted further inward. This may be achieved, for example, by making lateral cuts by means of a wafer cutter. The indentations 4 serve to connect the front emitter 7 to be created with the rear of the cell. They may also be viewed as vertical holes extending through the wafer 1 positioned at the very edge of the cell.

4. A subsequent phosphorous diffusion generates an n-doped emitter coating on the front of the wafer (front emitter 7), on the wafer edges, in the indentations 4 and on the nitride-free sections on the rear of the wafer (rear emitter 8).

5. In the fifth process step, an etching-resistant paste is applied to the rear of the subsequently remaining connecting areas 12, for example by means of screen printing methods, such that a section both of the nitride coating on the connecting area 12 and on the adjacent rear emitter 8 is covered by the paste.

6. The nitride, which is not protected by the etching-resistant paste, is removed in a hydrofluoric acid solution.

7. Thereafter, the etching-resistant paste itself can be removed again. Accordingly, an insulating nitride coating 10 will remain on a section of the connecting areas preventing a direct short circuit on the edges of the rear emitter areas 8 during the following series connection by means of screen printing.

8. In order to contact the cell bases an aluminum-containing paste is applied to the rear of the cells such that always the major part of the uncovered p-doped material of a sub-cell 2 is covered by the paste. During the subsequent contact burning a uniform base contact metallization 6 with an underlying p++ layer is produced. Said p++ layer generates a so-called back surface field which causes an increase in the diffusion of light-generated minority carriers in the direction toward the front or the emitter, respectively.

9. The rear emitter areas are contacted by means of a paste containing silver (emitter contact metallization 9) and connected with the base contact metallization 6 of the respective adjacent sub-cell via the nitride-covered section of the connecting areas 12. In the process, the paste is pushed through the indentations 4 as far as the front of the cell.

10. In a final screen printing step narrow metallization fingers (emitter contact fingers 5) can be applied to the front of the cell, also by means of a paste containing silver, which fingers are connected with the rear emitter metallization 9 via the indentations 4. This is followed by contact burning.

11. In the 11$^{th}$ process step, a few micrometers of silicon are removed along each wafer edge so as to eliminate the emitter coating on the wafer edges and the short circuits in the sub-cells resulting therefrom. Accordingly, the indentations 4 represent the only connections between the front emitter 7 and the emitter areas on the rear of the cell 8.

At the same time, the silicon between the sub-cells 2 can be removed completely, except for the areas of the contact connections 15. In the process, the front emitter 7 in the remaining cell connecting areas 12 is also separated. This process step is easily achieved with a silicon dice cutter. The wafer 1 is placed with its back on a rotating cutting table with vacuum intake. The adjustment required for removing the material between the sub-cells can be accomplished automatically by means of digital cameras based on the front emitter contact fingers 5.

A sawing machine having a spindle on which the appropriate number of separating saw blades is mounted runs over the waver. Before a complete cell separation has been achieved over the full width of the wafer the spindle alters its cutting level so as to cut the emitter in the remaining cell connecting areas 12 to a depth of some 10 μm. The same process is repeated after rotating the vacuum table by 180°, the spindle having a position which is offset by the width of one sub-cell. The result after the wafer 1 has been thinned can be viewed as a meandering strip of long solar cells.

1. In a final process step, an anti-reflection coating can be applied to the front of the cell.

Variations of the above described embodiment are possible. For example, channels 3 (FIG. 3) can also be used on the rear for further spatially separating the rear emitter 8 and the base contact metallization 6 of two adjacent sub-cells. These are preferably made in the wafer before the defect etching step (process step 1).

Figure 4:
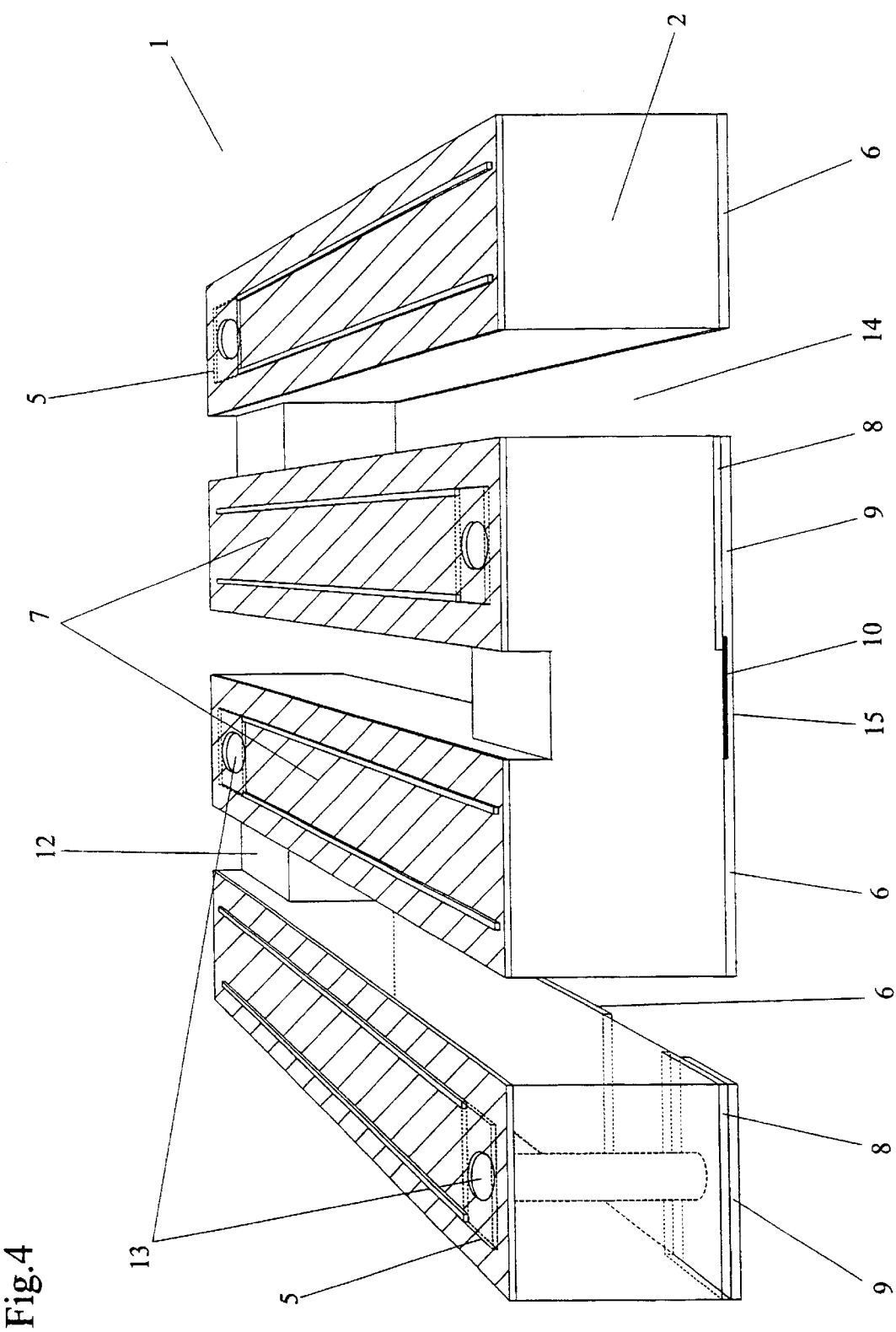
FIG. 4 a section of the front of a solar cell arrangement micro module with a monolithic circuit via holes through the wafer where, for simplification, the position of only a few holes is shown schematically and highly enlarged.

Furthermore, the indentations 4 can be omitted provided that holes 13 are used instead for connecting the front emitter 7 with the rear. For a simplified illustration only one large hole is shown in FIG. 4. The holes can be made both by means of sawing methods, for example crosswise double-sided sawing, or using tunable lasers or ultrasound cutters as are known in the art per se.

Figure 5:
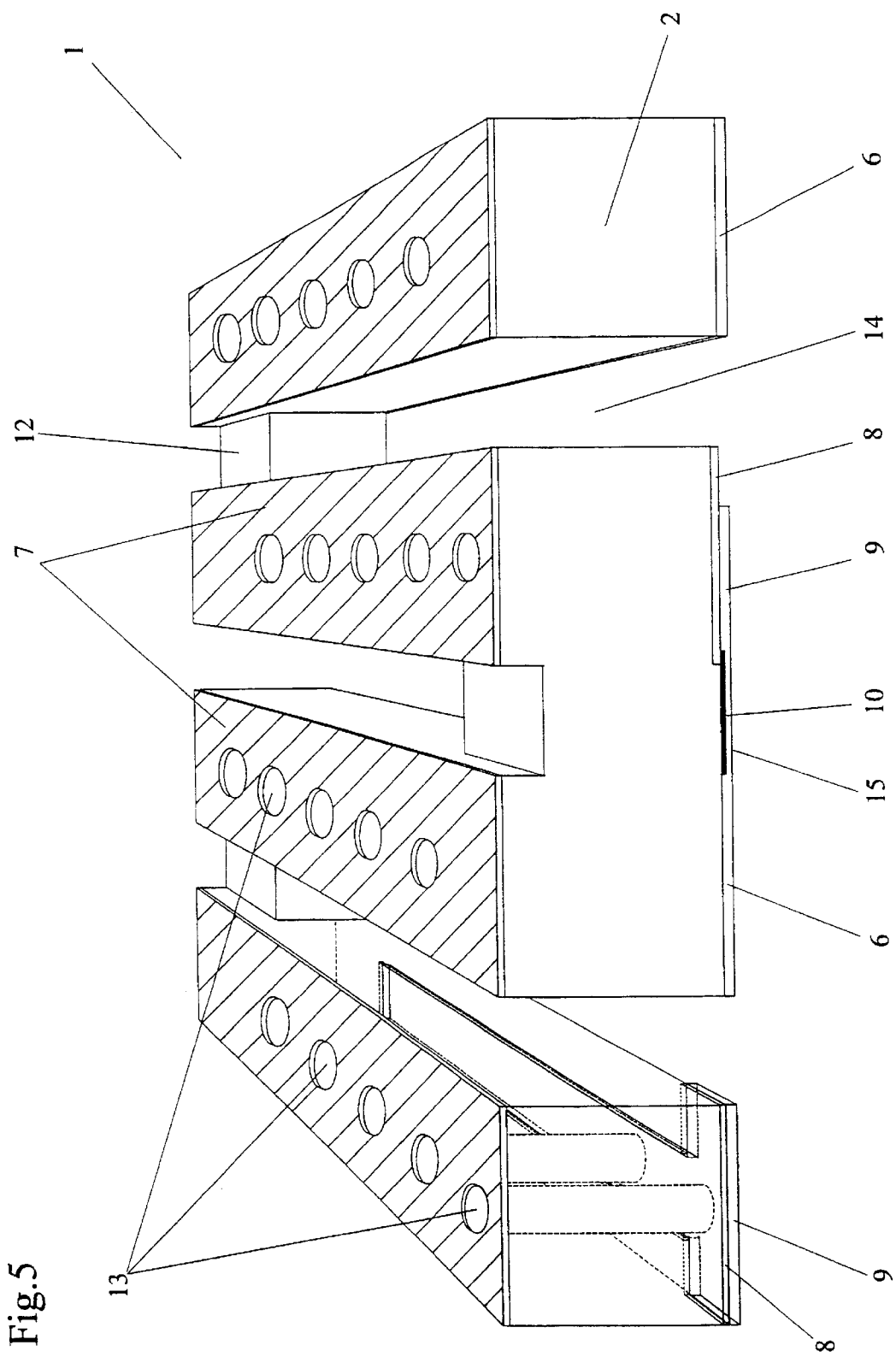
FIG. 5 a section of the front of a solar cell arrangement micro module with a monolithic circuit via holes through the wafer according to the emitter-wrap-through principle (for simplification, the position of only a few holes is shown schematically and highly enlarged)

Another option is to use the concept of the invention with the emitter-wrap-through method where the front emitter 7 is through-hole plated to the rear via many small holes 13 distributed over the entire sub-cell, as shown in FIG. 5, where, for simplification, the position of only a few holes is shown schematically and highly enlarged.

Figure 6:
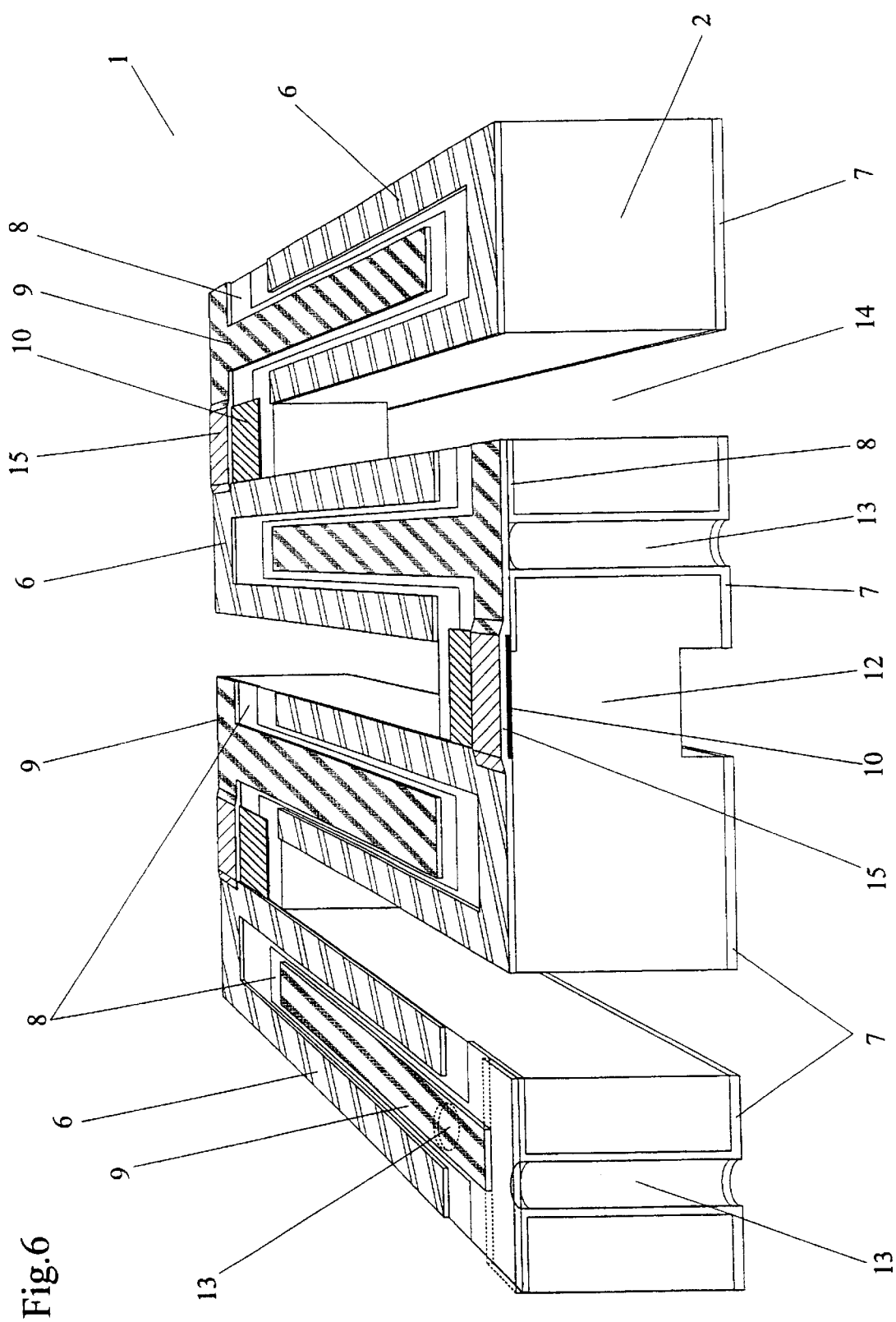
FIG. 6 a section of the rear of a solar cell arrangement micro module with a monolithic circuit via holes through the wafer according to the emitter-wrap-through principle where, for simplification, the position of only a few holes is shown schematically and highly enlarged.

The holes are also interconnected on the rear of the cell (FIG. 6) via strip-shaped emitters 8. The emitter contact metallization 9 is printed on the emitter strips, as is the base contact metallization 6, forming two interlinking contact grids on the rear of the cell. Using many holes distributed over the wafer decreases the path of the charge carriers along the emitter to the metal contact and thus the series resistance of a sub-cell is reduced. For this reason, front contacting the emitter can possibly be omitted in this embodiment. Producing and interconnecting the sub-cells is fully in accordance with the above described process.

In a further variant the remaining bridge segments 12 can be realized by means of an insulating substance, which is firmly bonded with the semiconductor, such as a polyimide. In this case, the areas of the wafer where the bridge segments are to be located are removed first. This can take place in process step 4, for example. Following the emitter diffusion these areas are then partially filled with a polyimide. When an insulating material is used for the entire bridge segment the steps for coating the bridge segments with an insulating or nitride coating are eliminated. Otherwise, the process is the same as the one described above.

The mechanical stability of the bridge segments is fully adequate for handling the cells. In case of the meandering geometry the wafer has a certain elasticity and can easily be twisted.

Figure 7:
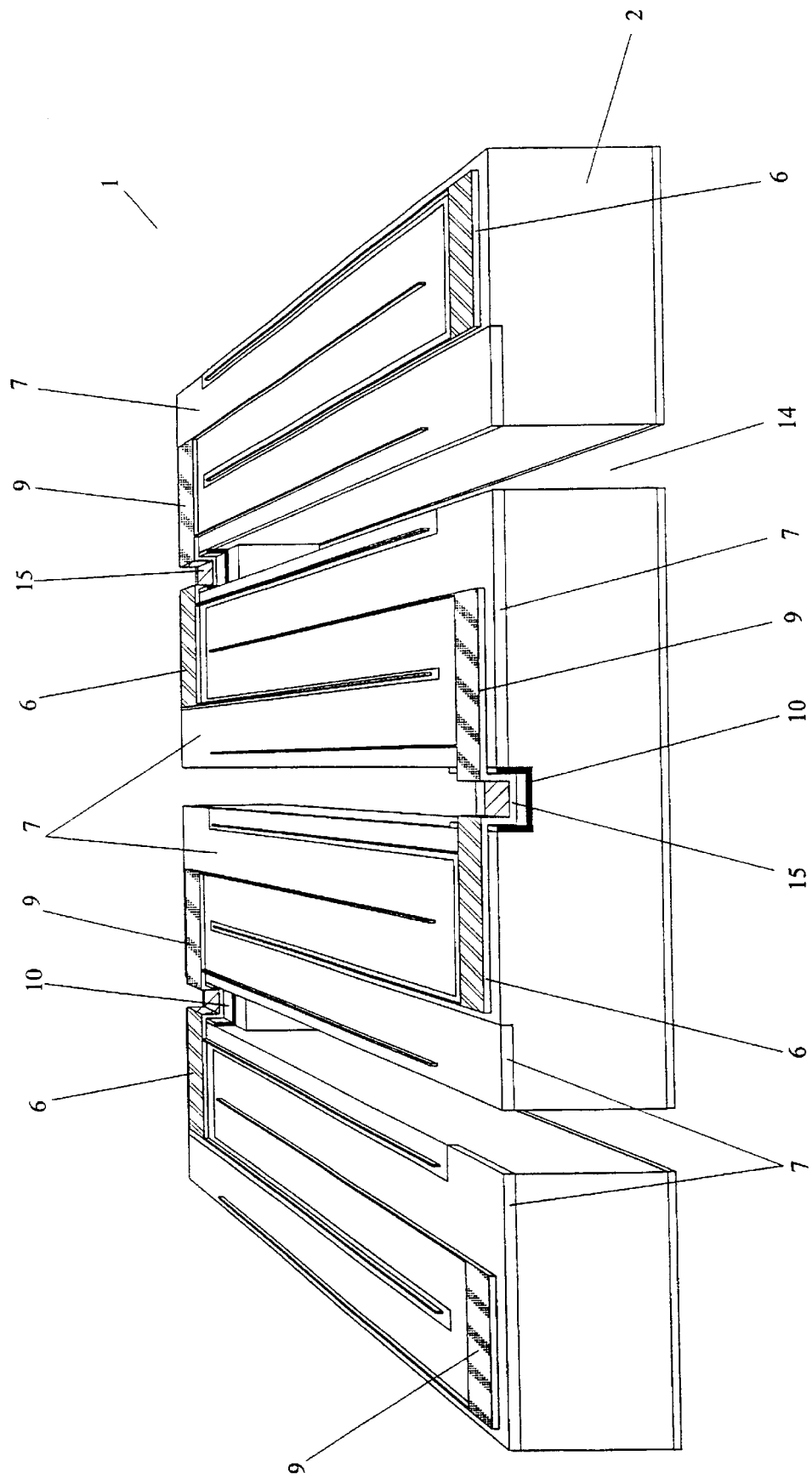
FIG. 7 a section of the front of a further exemplary embodiment of the solar cell arrangement micro module with a monolithic circuit via interlinking contact grids on the front and insulation of the contact connection by means of an insulating coating.

Instead of guiding the emitter to the base contact on the rear by means of indentations 4 (FIGS. 1–3) or holes 13 (FIGS. 4–6) as in example 1 the base contact (base contact metallization 6) can alternatively be shifted to the front of the waver 1, i.e. the side facing the light, see FIG. 7. While this has the disadvantage of an increased shading by the metal contacts for the emitter and the base it requires no connection for the emitter 7 through the wafer, which simplifies the process. The process can include the following steps:

1. During a first defect etching step the surface defects on the wafer are removed.
2. Thereafter, an emitter coating is produced over the entire surface by means of phosphorous diffusion.
3. An insulating coating, such as a nitride coating, is applied to the emitter so as to protect against the following etching steps. The areas which are intended to serve as a base contact are not covered by the insulating coating. This can be accomplished, for example, by using a mask during a PECVD nitride deposition.
4. For electrically insulating the sub-cells deep cuts 14 are made in the wafer alternating from two opposite wafer edges so as to create a meandering narrow strip of long solar cells where the remaining connecting area 12 can also be reduced via a channel.
5. A subsequent etching step using NaOH removes the surface defects caused by making the cuts 14 and the emitter coating in the areas that are not covered with nitride.
6. Similar to the method described in the exemplary embodiment No. 1 the nitride on the connecting area 12 of two sub-cells is now protected by means of an etching-resistant printing paste against the following etching step (hydrofluoric acid solution) serving to remove the nitride applied in step 3. Thereafter, the etching-resistant paste can be removed.
7. Thereafter, the rear of the wafer is provided with a p++ coating which should be as deep as possible. This may be achieved, for example, by means of screen printing using an aluminum paste and subsequent burning. In a second screen printing step, the finger grid of the base contact metallization 6 is applied to the front. Again, a paste containing aluminum is recommended for producing a p++ region below the fingers. In a final screen printing step the emitter contacting 9 takes place where at the same time a connection 15 with the base contact grid of the adjacent sub-cell is produced. The connecting silver coating is on top of the insulating coating 10 across the remaining connecting areas (bridge segments) 12. Finally, the entire front surface is provided with an anti-reflection coating for which a nitride coating can be used again, which additionally causes an electronic surface passivation.

Again, the insulator 10 serves to prevent a direct short circuit on the sub-cell edge where the base, the emitter 7 and the contact connection 15 would otherwise touch. Variations of the method are feasible. For example, instead of nitride a polyimide or another insulator available in the form of a printing paste can be used for preventing said short circuit.

Also similar to the first example illustrated by means of the first process a channel in the cell connecting area 12 can be omitted if an adequate spatial separation is achieved between the emitter and the adjacent base contact solely by applying an insulating coating 10 below the contact connection 15 of two sub-cells.

Figure 8:
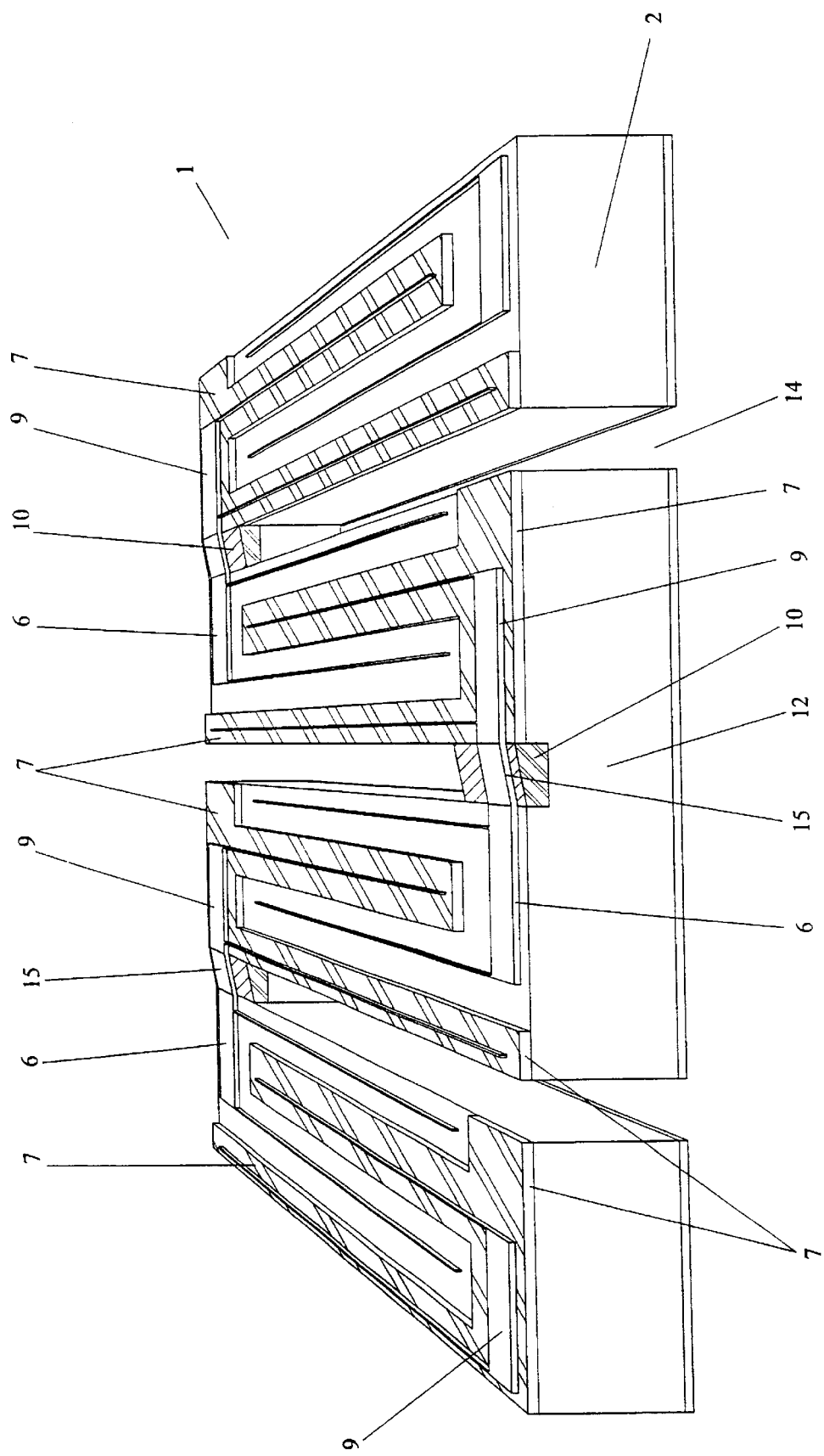
FIG. 8 a section of the front of a further exemplary embodiment of the solar cell arrangement micro module with a monolithic circuit via interlinking contact grids on the front and via base contact areas uncovered by means of planarizing cutter rollers.

Masking during the nitride deposition following the emitter diffusion is not required if both the nitride and the underlying emitter coating are removed by means of planarizing cutting cylinders when the base contact surface is subsequently exposed (FIG. 8).

In a further variant of the above embodiment the remaining connecting areas (bridge segments) 12 can be obtained by means of an insulating substance, which is firmly bonded with the semiconductor, such as a polyimide. In this case, the areas of the wafer where the bridge segments are intended to be located are removed first. This is accomplished between the process steps 3 and 4, for example. Said areas are then partially filled with a polyimide. When an insulating material is used for the entire bridge segment the steps for coating the bridge segment with an insulator or nitride coating, respectively, are omitted. Otherwise, the process is the same as the one described above.

Figure 9:
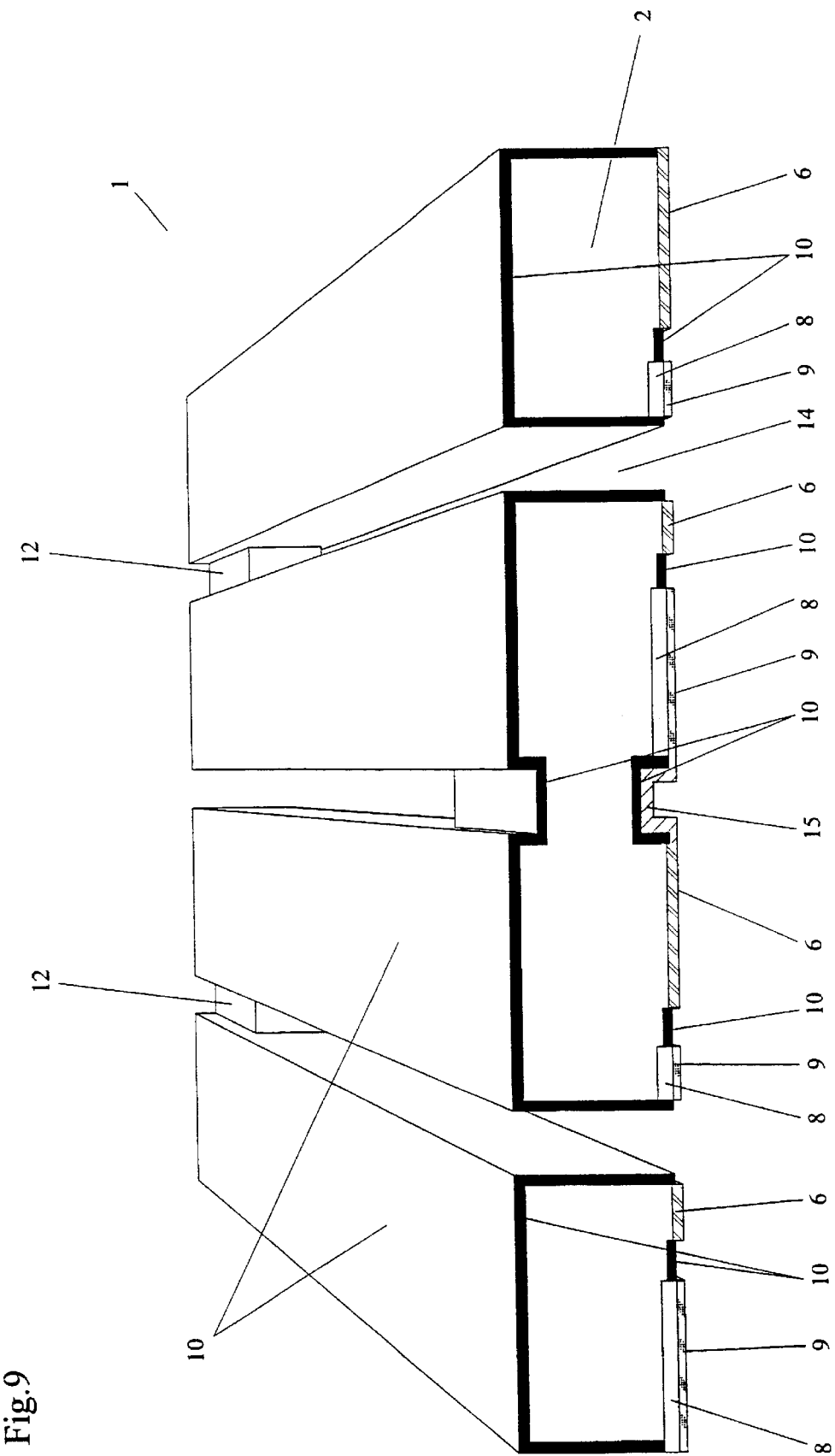
FIG. 9 a section of the front of a further exemplary embodiment of the solar cell arrangement micro module with a monolithic circuit via interlinking contact grids on the rear according to the "interdigitated-back-contact" solar cell concept having no front emitter and where the sub-cells are almost fully encompassed by a passivating surface coating.
Figure 10:
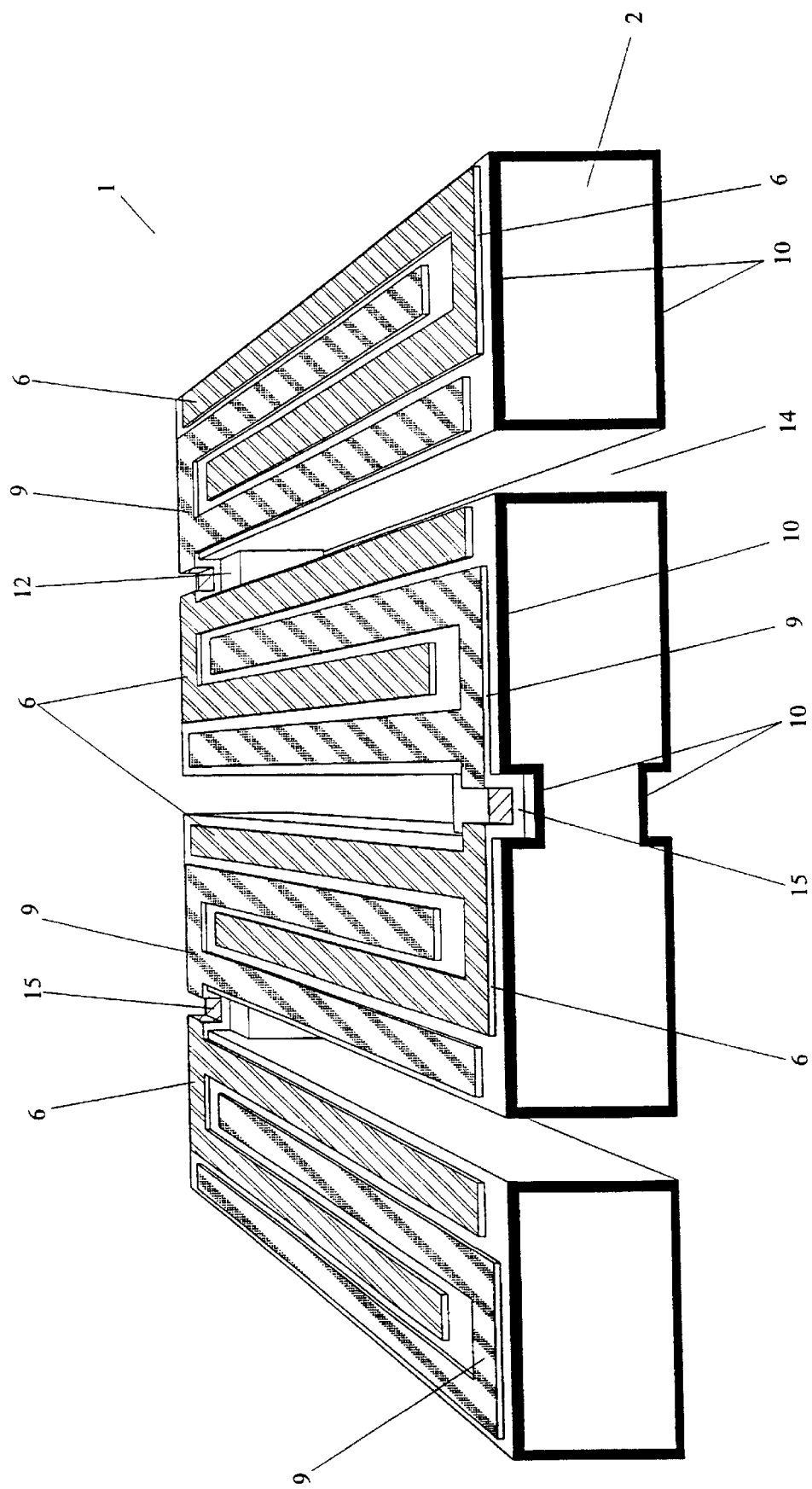
FIG. 10 a section of the rear of a solar cell arrangement micro module with a monolithic circuit via interlinking contact grids on the rear according to the "interdigitated-back-contact" solar cell concept.

According to FIGS. 9 and 10, a further variant of the solar cell arrangement micro module provides for both the base 6 and the emitter contact metallization 9 of the sub-cells 2 to be located on the side of the wafer opposite the light. In contrast to the previous examples, the front emitter is omitted completely (FIG. 9). The function of an individual sub-cell 2 corresponds to that of an "interdigitated-back-contact" cell which is used primarily in photo-voltaic concentrator systems.

On the rear of the sub-cell two interlinking metallization grids are mounted for the emitter 9 and the base contacts 6. The emitter area 8 is located directly below the metal fingers of the emitter contact grid 9 and thus it is fully metallized. The contact grids cover the rear surface of the cell almost completely. The remaining exposed areas are covered by a dielectric or an insulating coating 10, respectively, and are electronically passivated. The front of the cell, which is free of any metallization, is also covered by a passivating dielectric 10. Omitting a front emitter reduces the likelihood of collection for the charge carriers so that for producing the solar cell arrangement micro module according to this variant a high-quality semiconductor base material having an appropriate charge carrier diffusion length has to be used. Mono-crystalline silicon is a representative of such high-quality base materials. The particular advantages of this embodiment are the potentially achievable high efficiency of the sub-cells and thus of the solar cell arrangement micro module as well as the pleasing esthetics of the module as a result of eliminating the metallization on the front, which is particularly important for the use in high-tech consumer products, such as portable telephones.

A potential process sequence for producing said solar cell arrangement micro module of the invention is as follows:

1. Alternating from two opposite wafer edges deep cuts 14 are made in the wafer 1 so as to produce a meandering narrow strip of long sub-cells where the remaining connecting area 12 on both sides of the wafer is also reduced by a channel.
2. Defect etching the wafer.
3. Texturizing the wafer surfaces by means of anisotropic etching for generating and improving the so-called light trapping.
4. Applying a dielectric 10, such as a nitride coating, on both sides of the wafer 1 where the places where an emitter will be located are protected (for example by masking the wafer during the nitride deposition). The connecting areas 12 of the sub-cells 2 are also coated with the dielectric 10. At the same time, the dielectric should be able to serve as an anti-reflection coating and should be applied in the thickness required therefor.
5. Producing emitters 8 on the uncoated places by means of phosphorous diffusion, for example.
6. Applying the base metallization 6 on top of the dielectric (for example, screen printing with a paste containing aluminum).
7. Emitter metallization 9 on the uncoated places and applying the contact connections 15 between the base and emitter grids of adjacent sub-cells 2 (for example, screen printing with a paste containing silver). The contact connections 15 extend over the connecting areas 12 that are coated with the dielectric 10.

8. Co-burning emitter and base metallization. The contact burning process has to be coordinated such that the aluminum base metallization 6 is forced through the dielectric 10 and produces a contact to the cell base, while the silver-containing contact connection 15 should not yet penetrate the dielectric 10.

Reducing the connecting areas 12 between the sub-cells 2 serves for spatially separating the cells so as to reduce lateral currents from the diffusion of charge carriers to the respective adjacent sub-cells. The contact connections 15 are configured in accordance with the previous examples.

In order to achieve yet a higher efficiency the size of the highly diffused emitter areas and the area of the base metal contacts with the prevailing high recombination of charge carriers can be reduced. Accordingly, the dielectric for the emitter diffusion is opened only point by point. Both the cell emitter and the cell base are contacted via metallization points that are evenly spaced apart. The individual points for emitter and base contacts are electrically connected via two interlinking contact grids where the grid fingers are on top of the dielectric. The structure of the sub-cells then corresponds to the so-called "point contact solar cell" structure. A solar cell arrangement micro module with sub-cells thus configured can be produced in accordance with the above described process sequence.

It should be pointed out again that geometries other than the meandering form shown in examples 1 through 3 are also feasible. Accordingly, FIGS. 11*a*)–11*f*) are relevant for all examples.

Figure 12:
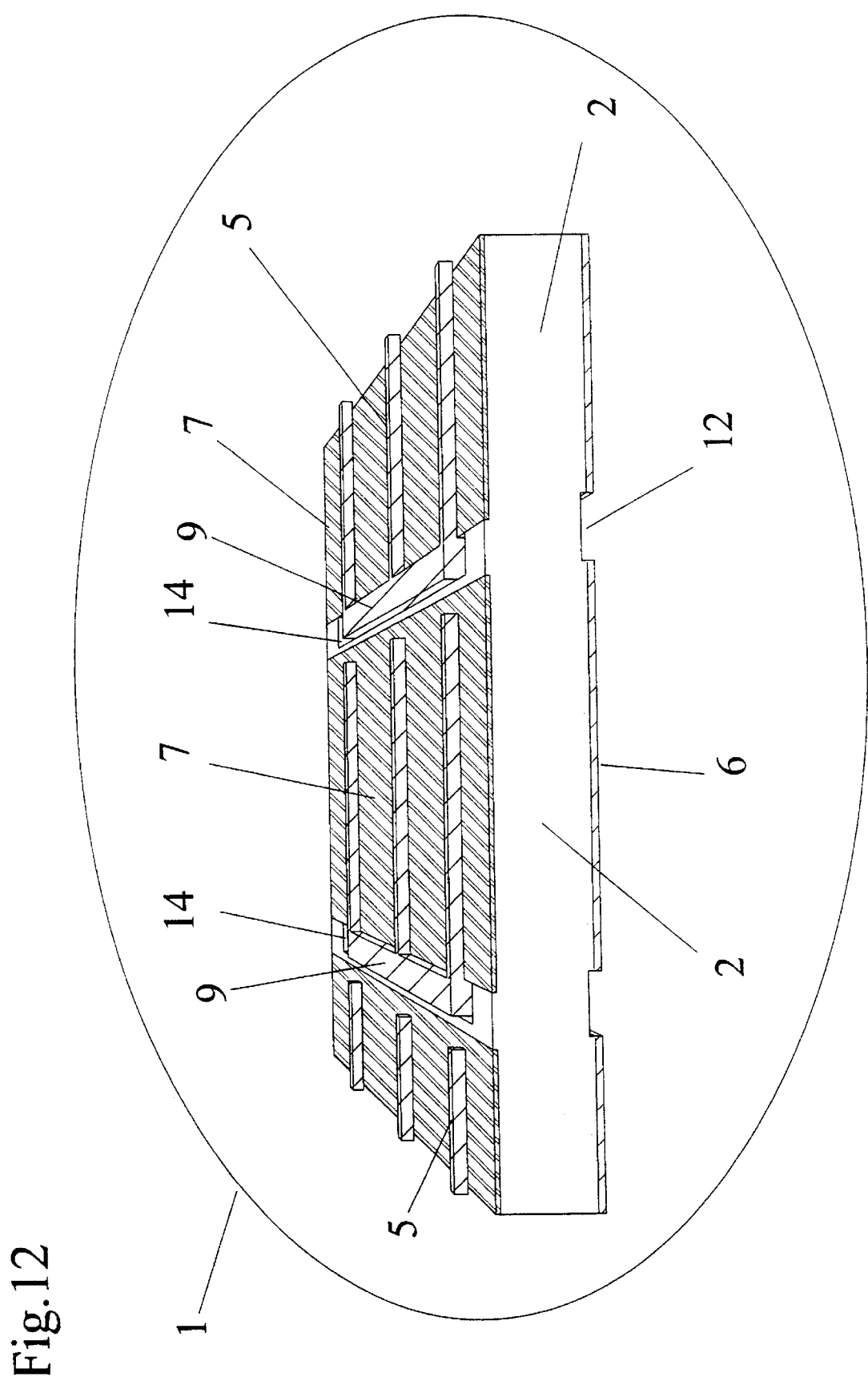
FIG. 12 a section of the front of a further exemplary embodiment of the solar cell arrangement micro module with a monolithic circuit across the cutting areas.
Figure 13:
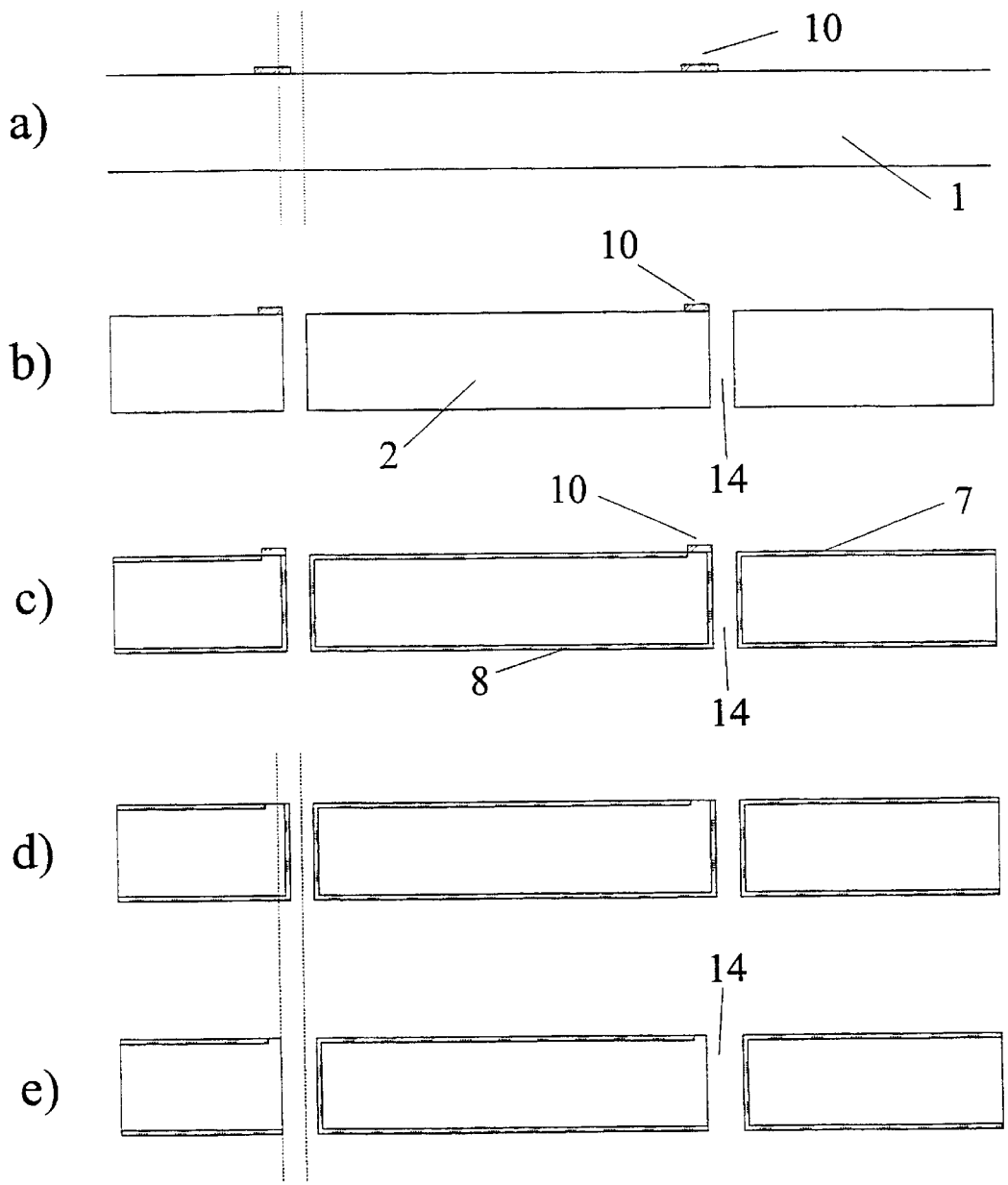
FIG. 13 an exemplary process sequence for producing a solar cell arrangement micro module according to FIG. 12.

According to FIGS. 12 and 13, a further embodiment of the solar cell arrangement micro module provides that the front emitter coating 7 of the sub-cells 2 is led through the cutting areas 14 to the rear of the wafer. Filling the cutting areas 14 with a conductive material (FIG. 13*a*) allows that two sub-cells 2 are directly interconnected. The advantages of this embodiment are the elimination of additional holes or indentations in the sub-cells, the large surfaced series connection of two sub-cells and thus minor series resistance in the module, and an excellent mechanical stability as a result of filling a large part of the cutting areas.

An potential process sequence for producing such a solar cell arrangement micro module is as follows:

1. Applying a diffusion barrier (such as a nitride coating 10) in the form of a strip (for example by using masks in a PECVD reactor) along the subsequent cutting area 14 (FIG. 13*a*).
2. Producing the cutting areas 14 along the diffusion barriers (FIG. 13*b*).
3. Defect etching the wafer and the cutting areas where the diffusion barrier remains largely intact. In the case of a nitride coating 10, this is achieved by means of etching with NaOH, for example.
4. Forming emitters, for example by means of phosphorous diffusion. The front and rear emitters (7 and 8) are then in connection via the cutting areas. A strip without emitter merely remains below the diffusion barrier (FIG. 13*c*). During the following etching off of the phosphorous glass by means of hydrofluoric acid solution the diffusion barrier is also removed (FIG. 13*d*).
5. Removing the emitter coating on one side of each cutting area 14 by means of cutting into the cutting areas 14 again (FIG. 13*e*) laterally slightly offset.
6. Applying the base contact metallization 6 of the sub-cells 2 on the rear of the wafer, for example by means of screen printing using a paste containing aluminum. The rear emitter coating 8 which is initially located below the contact is overcompensated thereby (FIG. 13*f*).
7. Applying the front emitter contact finger 5 and at the same time interconnecting the sub-cells, for example by means of screen printing using a paste containing silver. When the contact fingers 5 are applied the paste is also pushed through sections of the cutting areas 14 to the rear of the wafer (FIG. 13*g*).

A cutting area 14 filled with metal then serves both as a bus bar for a sub-cell and as a contact connection 15 of two sub-cells. Additionally, the stability of the wafer also improves.

8. Co-burning the contacts.
9. Removing the emitter coatings on the outer wafer edges and between the non-metallized areas on the rear of the wafer, for example by means of plasma etching. This produces recesses 23 that prevent the sub-cells from short circuiting on the edges of their base contacts (FIG. 13*h*).

The above process step 5 should be viewed as optional because the n-coating removed thereby is not in connection with the actual cell emitter 7 because of the nitride coating 10 and the base metallization 6, and therefore it is inactive.

Figure 14:
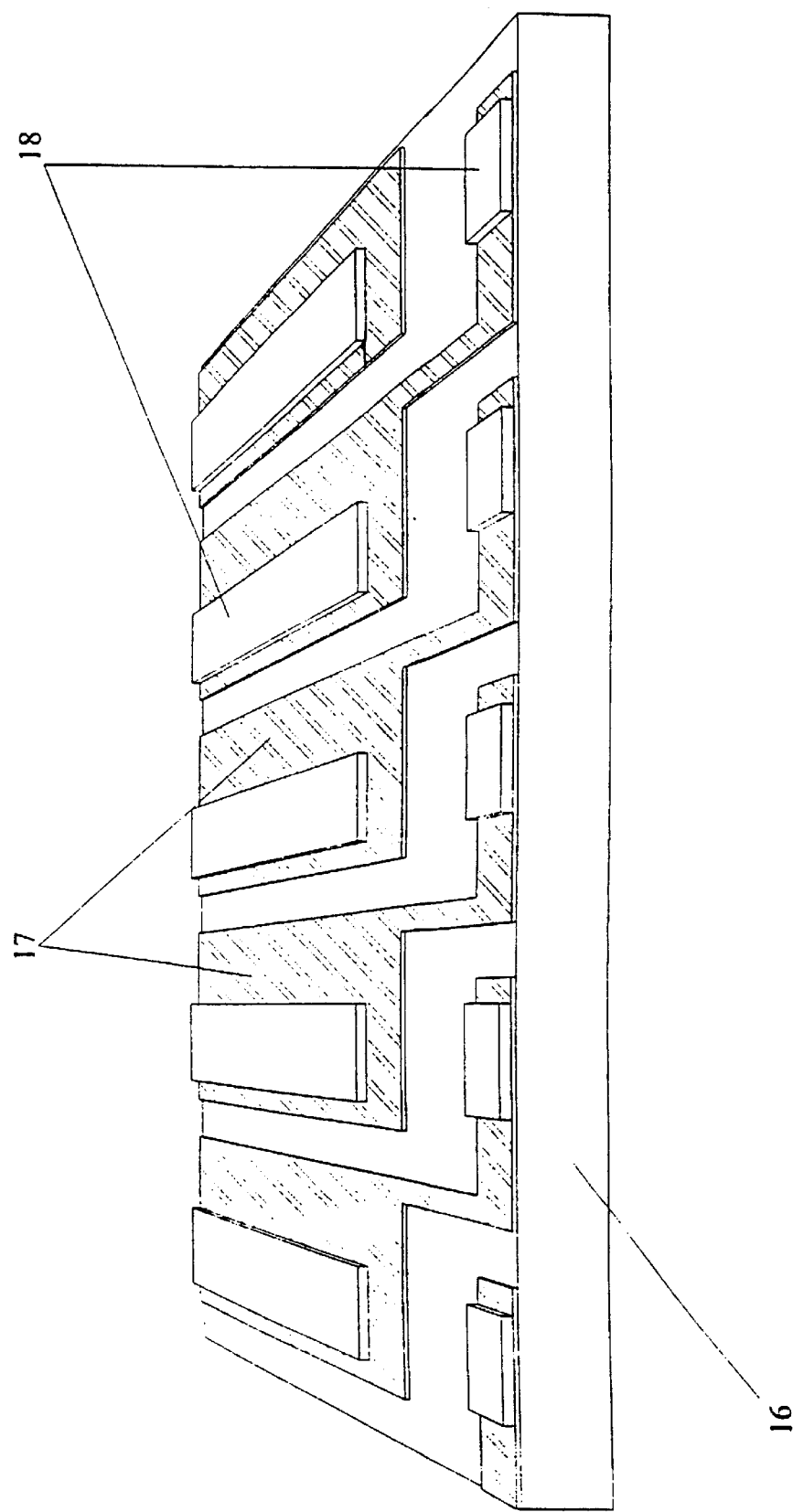
FIG. 14 a section of the front of a further exemplary embodiment of the solar cell arrangement micro module with a monolithic circuit across the cutting areas in accordance with the EWT concept.
Figure 15:
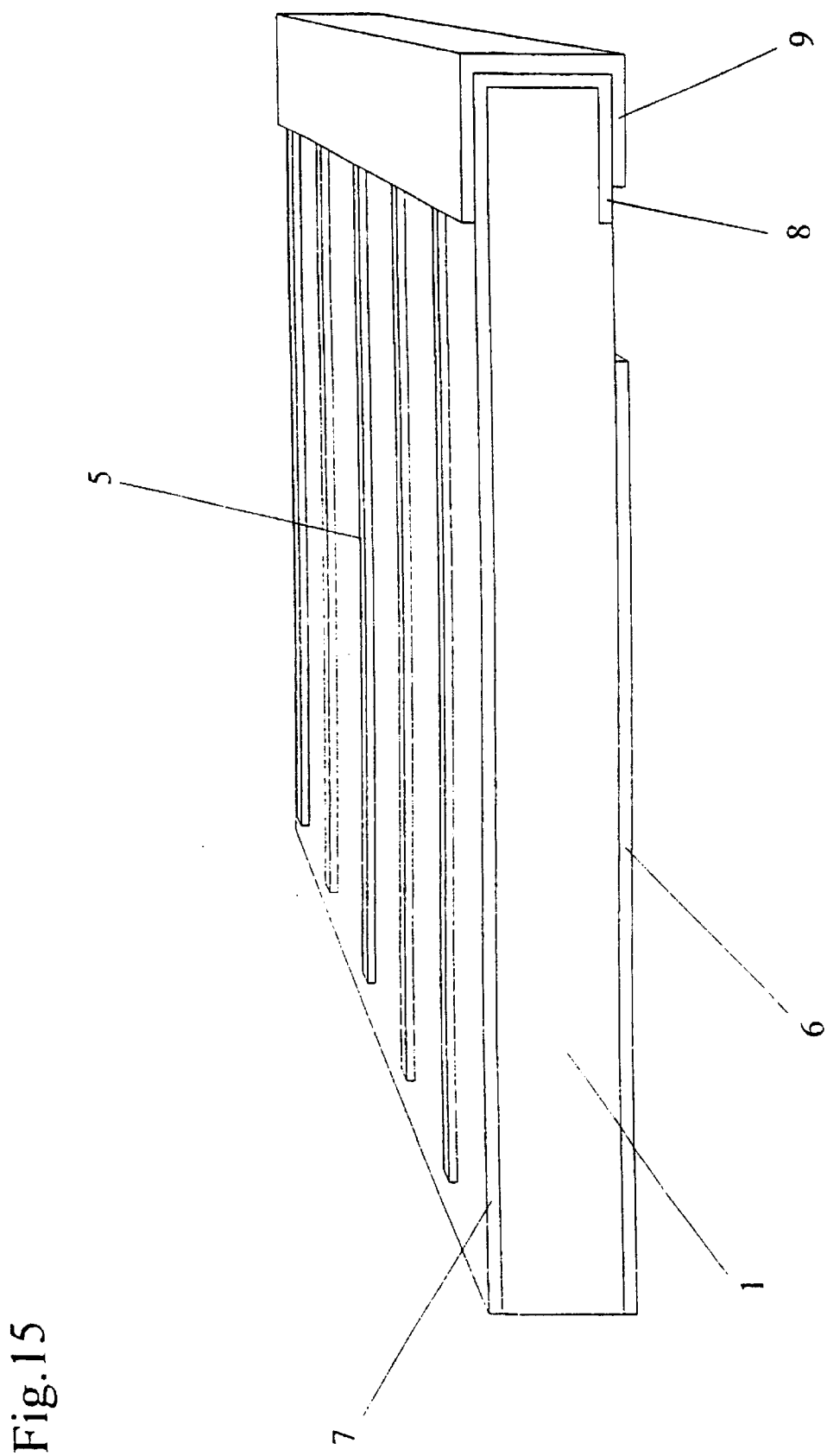
FIG. 15 a section of the rear of the solar cell arrangement micro module with a monolithic circuit across the cutting areas in accordance with the EWT concept.

According to FIGS. 14–16, an embodiment of a solar cell arrangement micro module based on an EWT design is as follows. The base 6 and emitter contact metallizations 9 of a sub-cell are located on the rear of the cell and form an interlinking finger grid. The cutting areas 4 (insulating channels) are filled when the emitter contact metallization 9 is applied, thereby achieving a series connection of two adjacent sub-cells 2 during the following application of the base metallization 6 as a result of the two metallizations overlapping in the cutting area 14. FIG. 14 shows the front surface, FIG. 15 the rear surface of such a solar cell arrangement micro module. FIGS. 16*a*–16*j* illustrate a potential production process.

As in the previous examples, some areas of the sub-cells have to be protected against the emitter diffusion. In the previously described process sequences said areas were coated by a nitride coating.

Figure 16A:
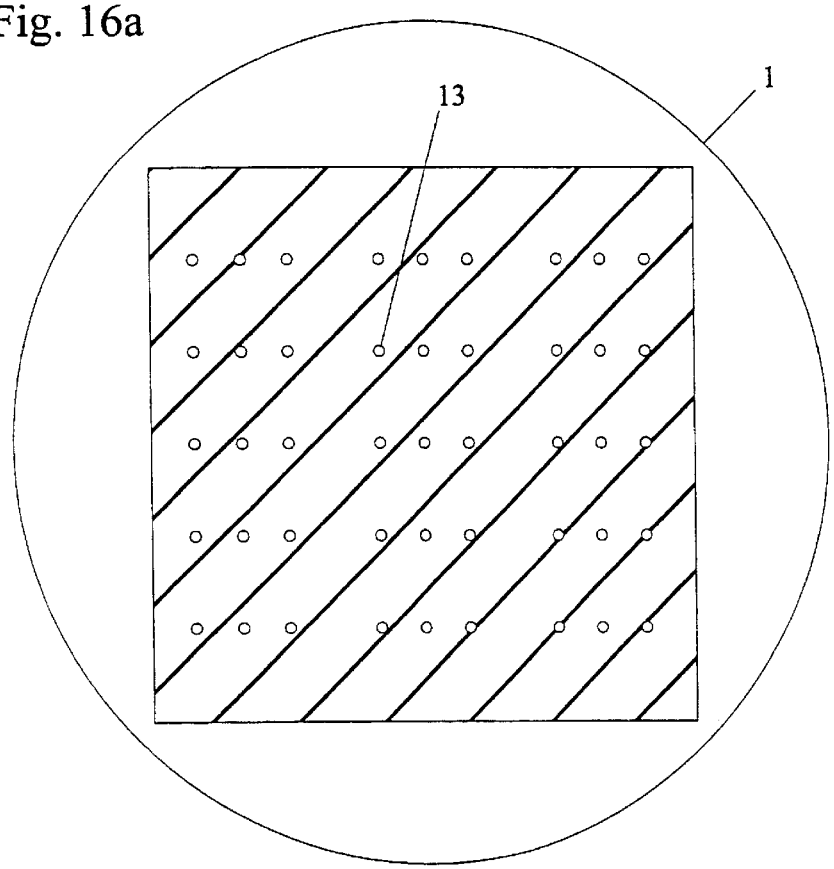
FIGS. 16a–j an exemplary process sequence for producing a solar cell arrangement micro module with a monolithic circuit.
Figure 16B:
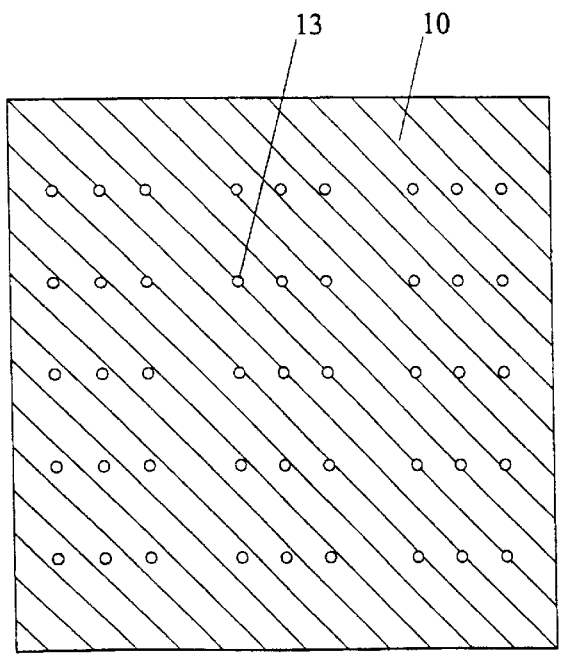
Figure 16C:
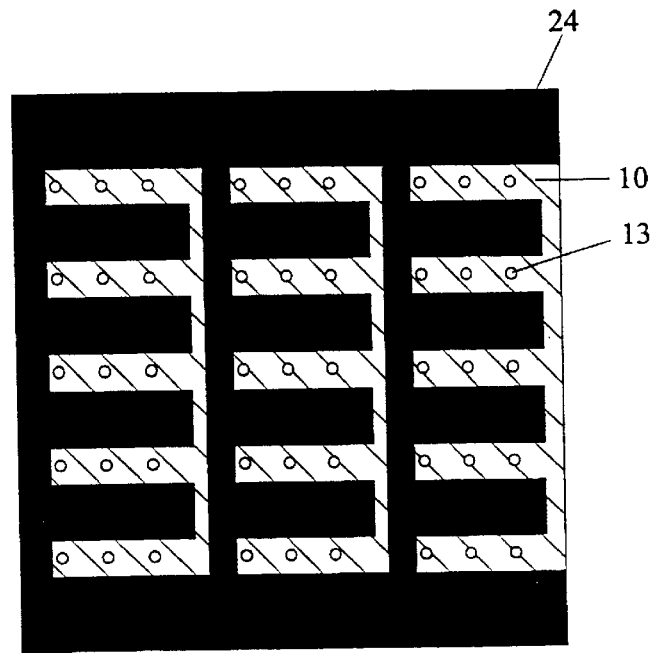
Figure 16D:
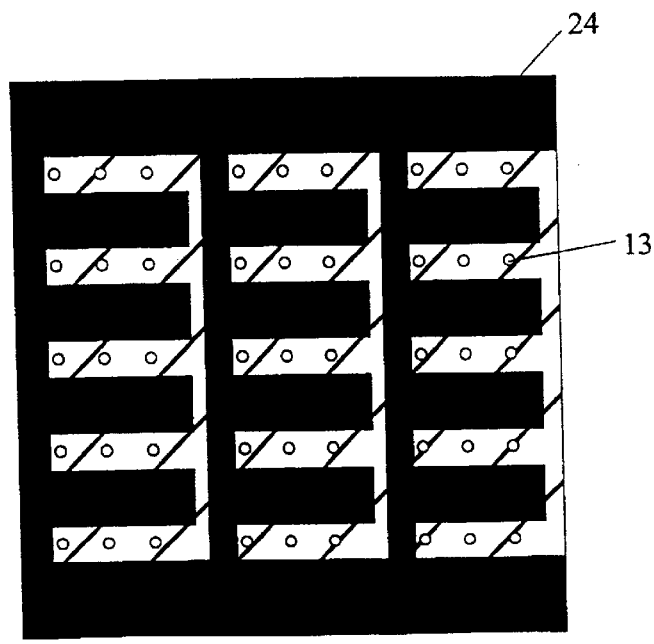
Figure 16E:
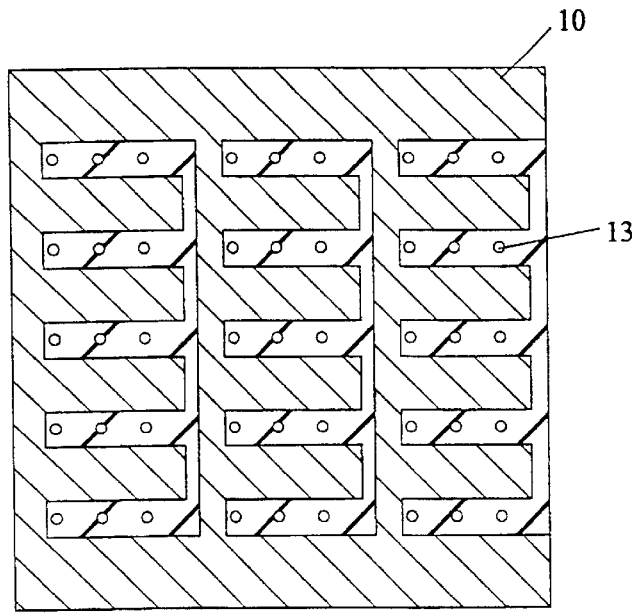
Figure 16F:
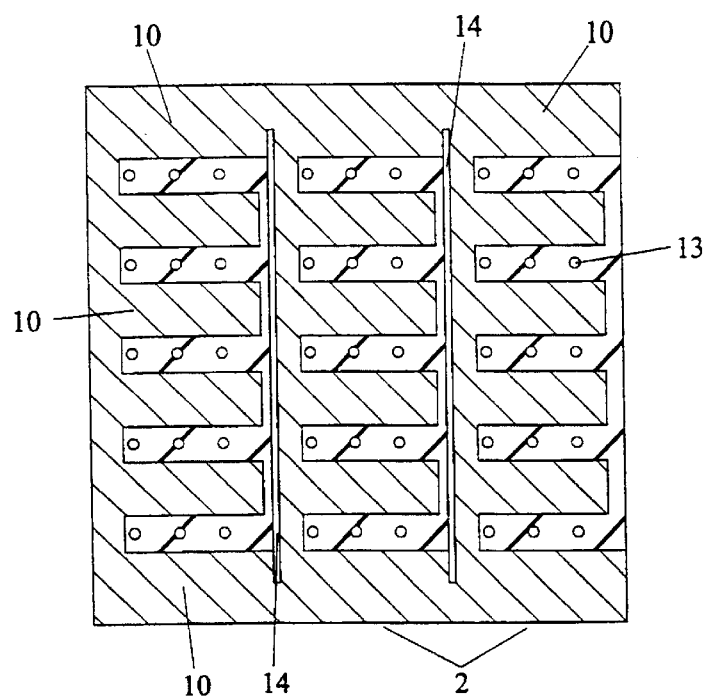
Figure 16G:
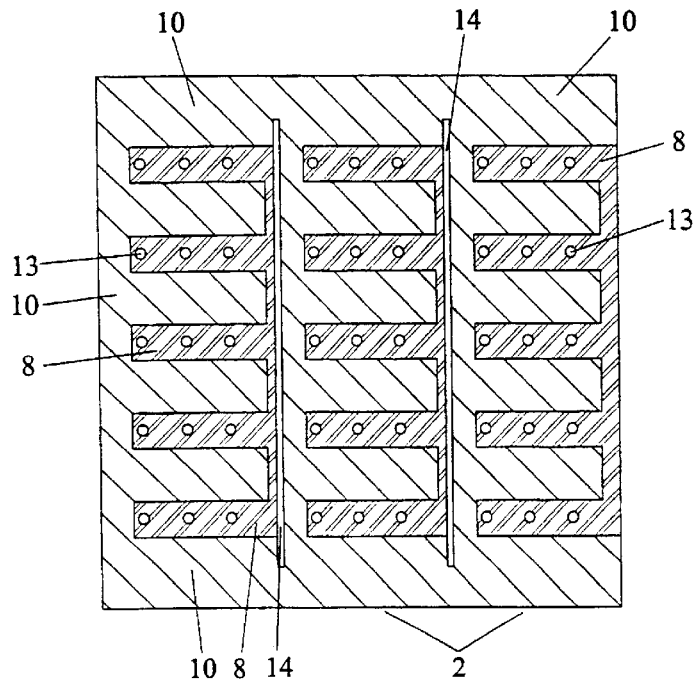
Figure 16H:
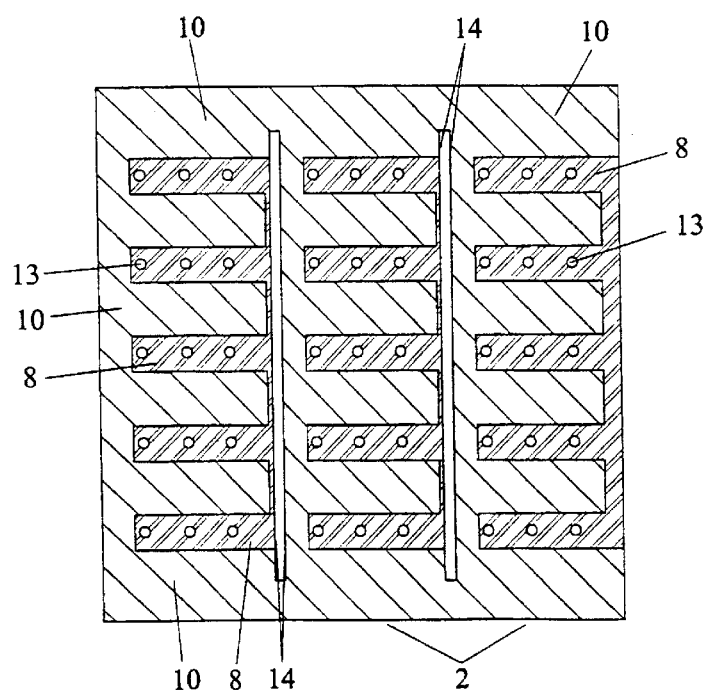

Nitride-free areas are produced by means of applying a mask during the nitride deposition. The following embodiment, however, does not use any masks. Instead, nitride is first applied over the full surface which is then subsequently removed again by means of etching from the areas to be provided with an emitter. The nitride-covered areas which are to remain are protected against etching by an etching-resistant screen printing lacquer. This method is described here only as an example. It is also applicable to all other embodiments. Therefore, the production process is as follows:

1. Laser cutting holes 13 which subsequently lead the front emitter 7 to the rear of the cell (FIG. 16*a*).
2. Defect etching the wafer.
3. Applying a diffusion barrier (such as a nitride coating 10) on both sides over the full surface (FIG. 16*b*).
4. Applying an etching-resistant lacquer 24 on both sides of those cell areas which actually have to be protected against the emitter diffusion. As in example 4, this is a narrow strip on the front of the cell along the cutting areas, and, differing from example 4, the areas of the subsequent base contacts on the rear of the cell (FIG. 16*c*).
5. Removing the diffusion barrier (nitride coating 10) from the areas to be provided with an emitter by means of etching (for example, etching by means of freon in a plasma etching reactor) (FIG. 16*d*).
6. Removing the etching-resistant lacquer by means of solvents (FIG. 16*e*).

Figure 16I:
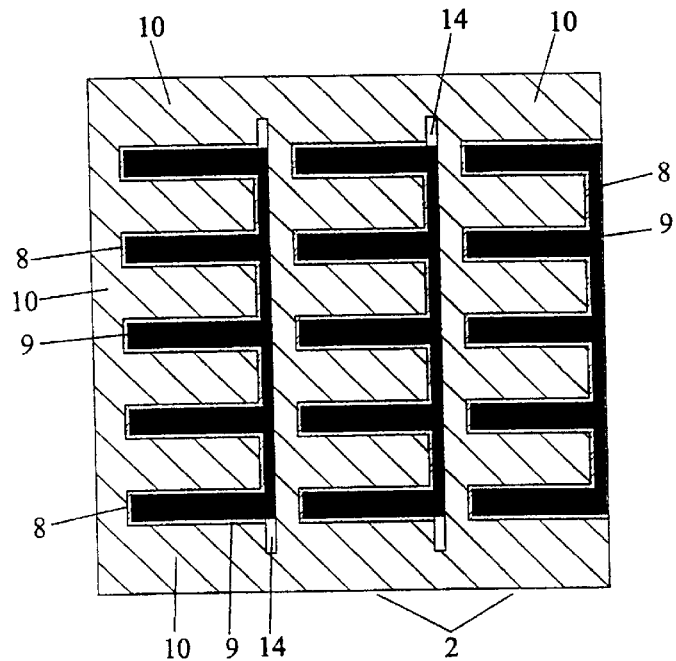
Figure 16J:
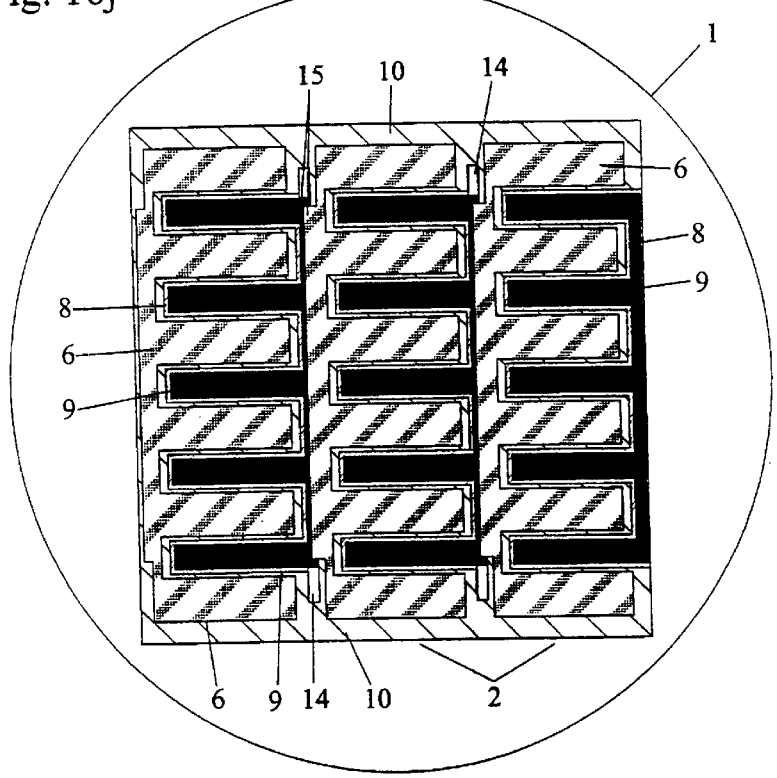

7. Making the insulating cuts (cutting area 14) along the edges of the front diffusion barriers (also see example 4) (FIG. 16*f*).
8. Defect etching the insulating cuts (by means of NaOH, for example).
9. Forming the emitters (by means of phosphorous diffusion, for example) (FIG. 16*g*).
10. Removing the emitter coating from one side of each cutting area 14 by cutting again into the cutting areas 14 laterally slightly offset (also see example 14) (FIG. 16*h*).
11. Applying the emitter contact metallization 9 on the rear emitter areas 8, for example by means of screen printing using a paste containing silver. In the process, the holes 13 and the cutting areas 14 are filled with metal (FIG. 16*i*). A cutting area 14 filled with metal then serves both as a bus bar for a sub-cell and, in part, as a contact connection 15 of two sub-cells (FIG. 16*j*).
12. Applying the base contact metallization 6 on the nitride-protected areas, for example by means of screen printing using a paste containing aluminum (FIG. 16*j*). In the cutting areas 14, the emitter and base contact metallizations of two adjacent sub-cells will overlap, thus resulting in a series connection of the subcells.
13. Co-burning the contacts. The aluminum-containing paste of the base contact metallization 6 etches through the nitride coating 10 and thus produces the contact to the base material.
14. Removing the emitter coatings from the outer wafer edges, for example by means of a wafer cutter.

Figure 17:
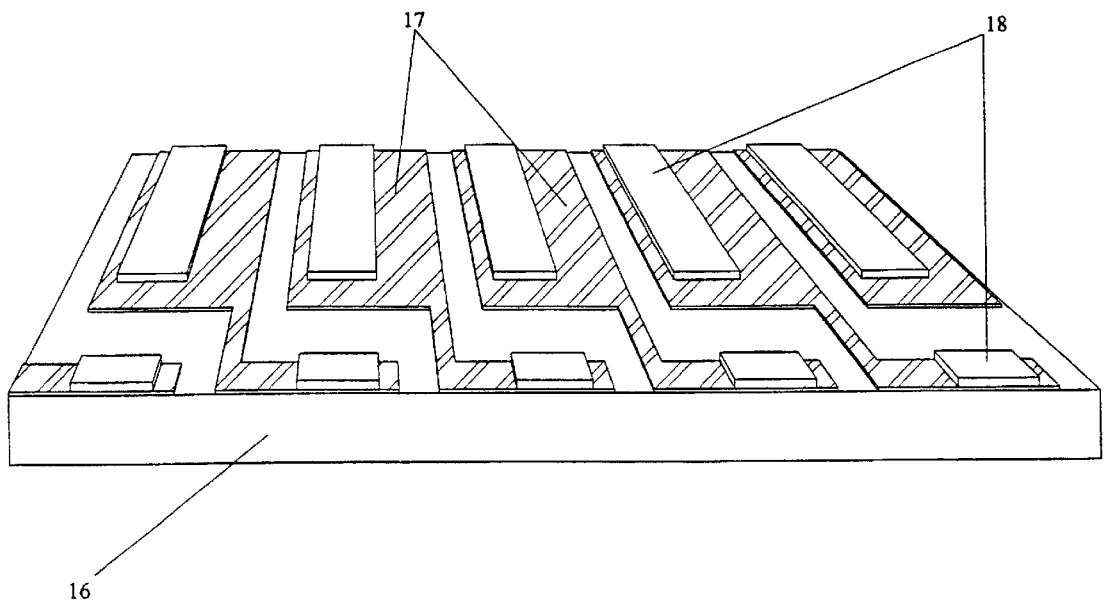
FIG. 17 a carrier board with strip conductors for series-connecting including applied soldering material.

A further variant for producing a solar cell arrangement micro module is based on using a carrier substrate or a carrier board 16 (FIG. 17) for connecting the sub-cells. To this end, solar cells have to be produced whose emitter and base contacts are disposed on the rear of the wafer. In principle, the cell designs introduced in the preceding examples, such as "emitter-wrap-through" and "interdigitated back contact solar cell" can be used.

Figure 18:
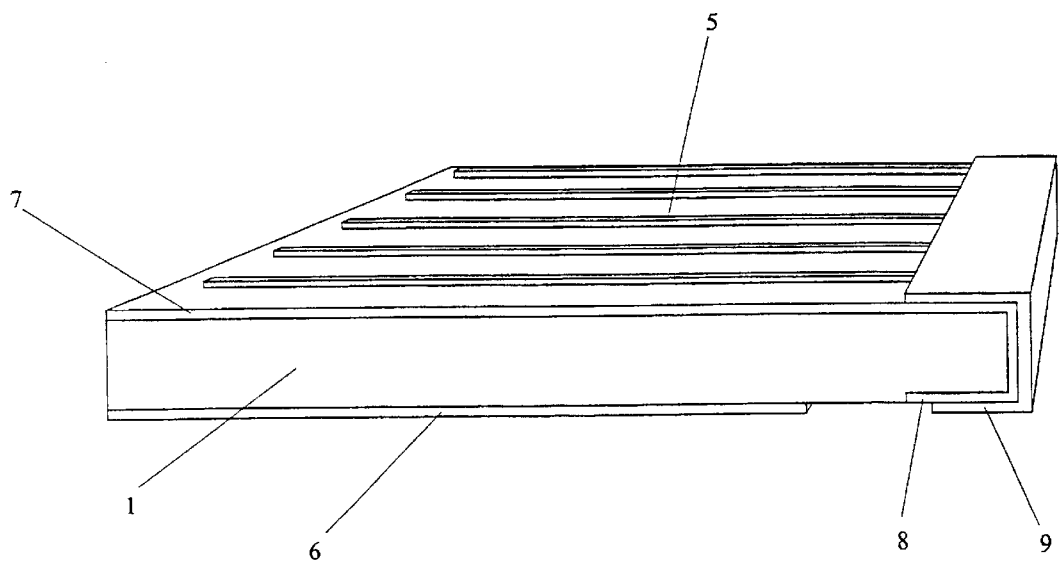
FIG. 18 a solar cell with an emitter drawn around the wafer edge and with an emitter contact.

In this example, the emitter-wrap-around cell concept will be used. According to this concept (FIG. 18) the front emitter 7 is guided along a wafer edge to the rear (rear emitter 8). On the front, contact fingers adapted to the geometry of the sub-cells to be formed are applied and guided to the rear of the cell via the wafer edge which is provided with an emitter coating. This means that a wafer edge is also metallized. The base contact metallization 6 is applied strip-like in accordance with the subsequent geometry of the sub-cells, however, without touching the rear emitter contact 9. The carrier substrate 16 (FIG. 17) on which the solar cell will be permanently mounted carries strip conductors 17 forming a connection between the base contact 6 and the rear emitter contact 9 of the adjacent sub-cell (FIG. 18). If the cell is soldered to the substrate the cell will be at a level of several 100 μm above the strip conductors 17 because of the soldering material 18. Consequently, the cell can subsequently be divided into sub-cells by means of a silicon dice cutter, which sub-cells are then already interconnected and whose bases are fully insulated with respect to each other.

Many different materials are suitable for the substrate. They merely have to insulate or be capable of carrying insulating coatings and conducting strips and withstanding the temperatures when they are joined to the primary cell. Materials on which the strip conductors can be defined, for example by means of screen printing, are preferred because the carrier substrates can easily be adapted to the various applications by the manufacturer of the cells, but producing the solar cell arrangement micro module directly on strip conductor boards used in the electrical engineering industry is also feasible.

This method is characterized in that it allows an easy large-surfaced production of both the sub-cells and the substrate where the cells are interconnected in one single step (such as soldering, adhesion or bonding) and the sub-cells are interconnected before they are separated, thereby eliminating the comparatively costly handling of individual sub-cells, and allowing a simple cell separation without damaging the substrate or the strip conductors, completely insulating the cell bases, and integrating the solar cell arrangement micro module in electronic boards and circuits already at the time when it is produced. A potential process sequence is as follows:

1. Defect etching the basic wafer.
2. Nitride deposition on the rear of the wafer where a strip along a wafer edge remains free of a nitride coating by means of . . . [sentence incomplete] (for example by using a mask in a PECVD reactor).
3. Forming the emitter (phosphorous spray-on, phosphorous paste printing, phosphorous diffusion).
4. Removing the nitride.
5. Nitride deposition on the front for producing an anti-reflection coating.
6. Applying rear contacts to the cell base (Al-Ag screen printing for easier soldering).
7. Applying front contacts (Ag screen printing).
8. Applying the emitter contact on the wafer edge and the rear (for example, by lightly dipping the wafer edge in Ag printing paste).
9. Burning the contacts through the nitride.
10. Applying the soldering material 18 on sections of the strip conductors 17 of the substrate.
11. Applying and soldering the wafer to the substrate. The solder paste produces an electrical contact to the rear base metallization 6 and the rear emitter metallization 9 on the wafer edge.
12. Dividing the cells into sub-cells.

Figure 19:
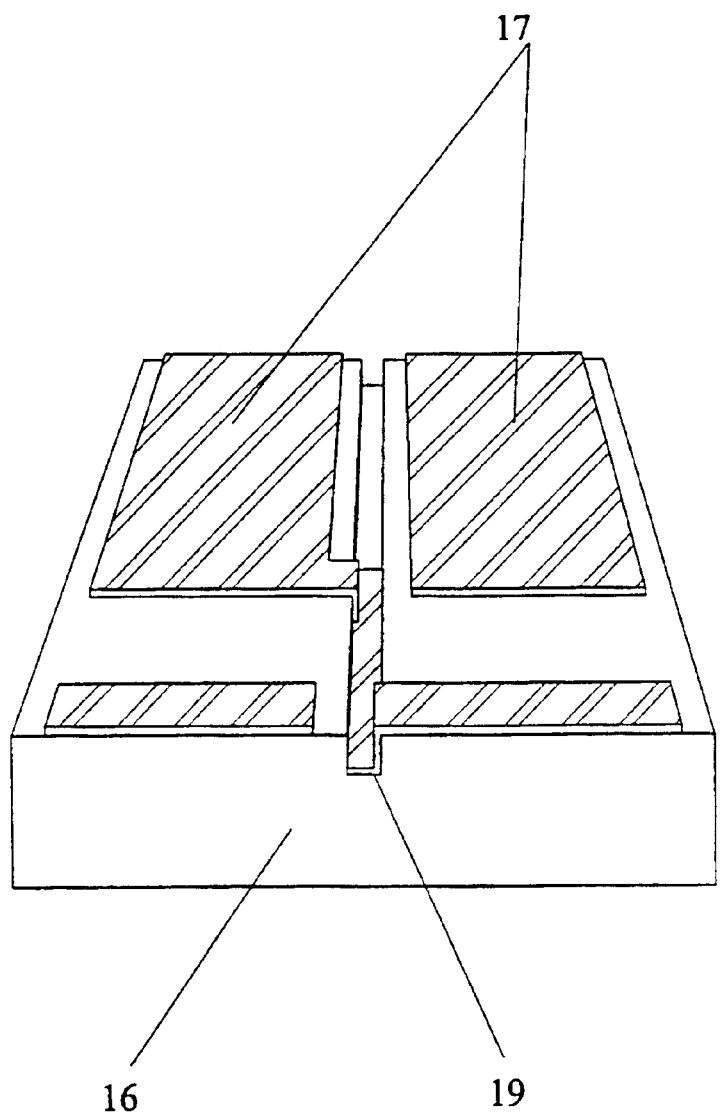
FIG. 19 a section of a carrier board with substrate channel and strip conductors.

If a simple series production, primarily of the substrates, should require even higher tolerances in the cutting level the substrates can already be provided with channels 19 (FIG. 19) along which the cutting blades will run when the waver is separated without engaging in the substrate 16.

While in the previous examples the emitter and base contacts were always disposed on one side of the wafer for achieving a series connection, according to a further variant the emitter and base contacts remain on separate sides of the wafer. This allows using commercially available solar cells for producing the solar cell arrangement micro module. Because of the potential negative consequences of cutting a metallization coating (such as impairment of the cutting tool, metal carry-over on the cutting edge with localized short circuiting at the pn-junction) the rear contact and the bus bars of the front grids should not be configured continuous. Instead, they should have gaps in accordance with the strip form of the sub-cells along which the wafers can be thinned or cut. This means that, except for using different metallization printing screens, an existing cell production process will not have to be altered.

Figure 20:
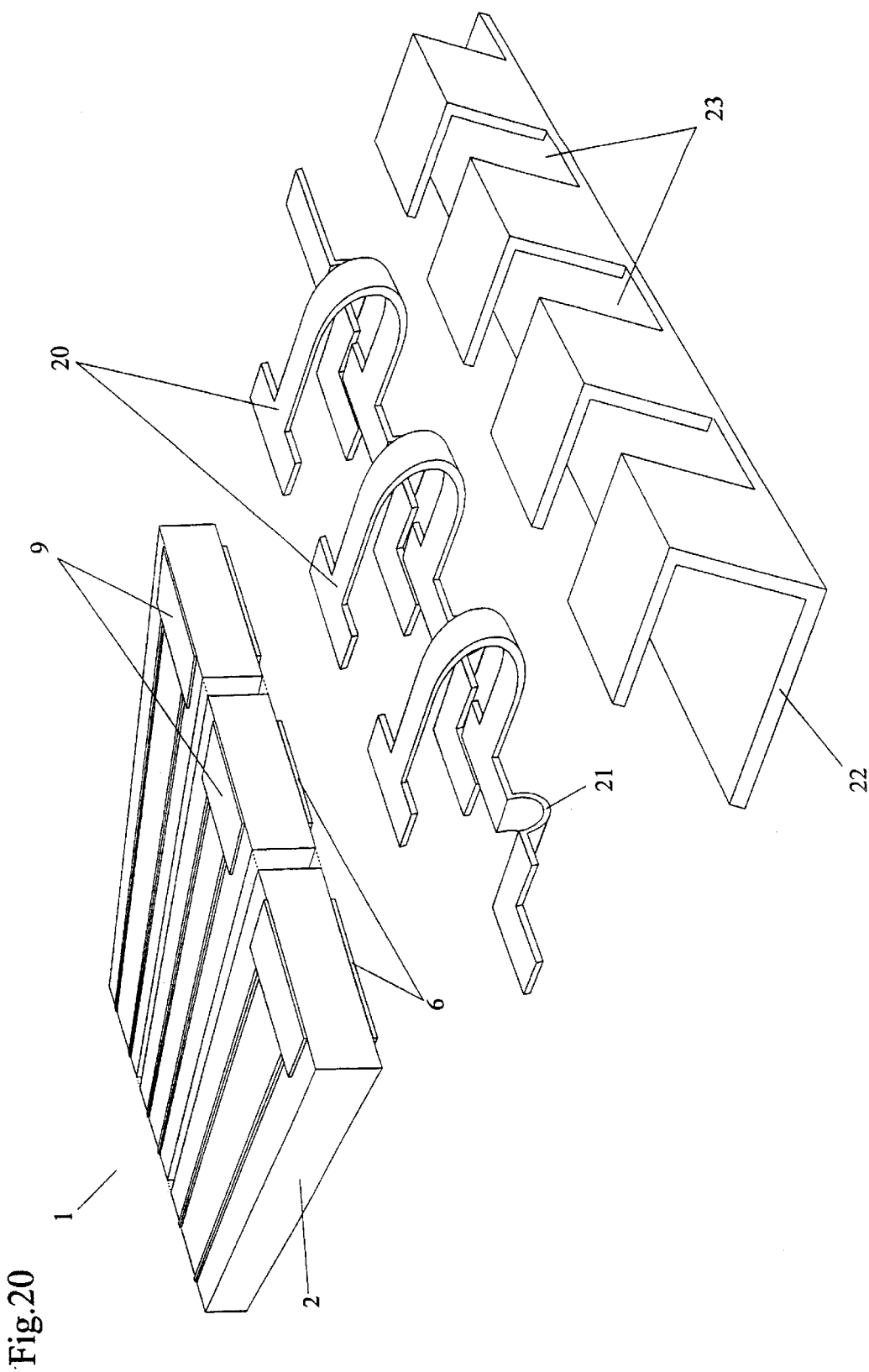
FIG. 20 a number of contact bows representing components of a contact bank having recesses, and a number of solar sub-cells.

As already described above, the sub-cells are contacted before they are separated by means of an external connecting element. In this case, however, this takes place by means of a contact bank to be mounted laterally on a wafer edge. The inside of the contact bank houses strip conductors and contact pins or metallic contact bows 20 (FIG. 20) connecting the rear contact of a sub-cell with the front contact of an adjacent sub-cell.

Conceivably, a film provided with strip conductors can also be used as the contact bank or a part thereof.

Figure 21:
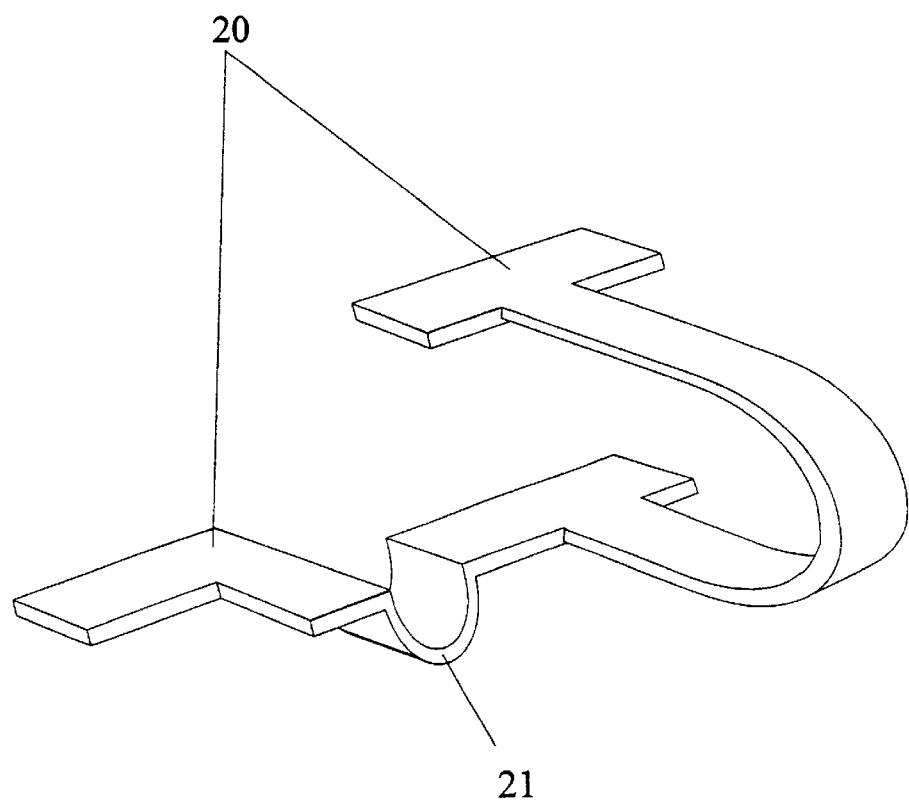
FIG. 21 view of a single contact bow with a bracket through which the cutter blades can be guided for separating the sub-cells.

When metallic contact bows are used the ends of the bows are soldered mechanically to the base 6 and emitter contacts 9 of the sub-cells. The housing 22 can be provided with appropriate recesses so as to ensure that the bows can be reached with soldering tips. It is understood that other methods of joining, such as welding or adhesion with a conducting adhesive agent, can also be applied. Each individual contact bow 20 (FIG. 21) in this embodiment consists of a bow encompassing the wafer edge and a metal strip disposed vertically thereto which contacts the rear of an adjacent sub-cell. Each contact bow 20 has a bracket 21 through which the cutting tools, such as cutting blades, can be guided for producing the sub-cells. At the same time, said brackets 21 provide a mechanically flexible interconnection of the sub-cells. Accordingly, the face and top side of the housing 22 is discontinuous (recesses 23) so as to allow the wafer to be separated into sub-cells by means of a wafer cutter, for example. Two strips on opposite wafer edges provide the micro module with increased stability and reduce the series resistance and provide a certain redundancy in case a soldered joint should be defective.

The brackets 21 can be omitted if, as in example 6, the wafer lies some 100 μm above its bearing surface because of the soldering material and the cutting blades move over the bow ends when the wafer is separated.

By using long contact banks allowing multiple source wafers or primary cells to be encompassed multiple micro modules can be interconnected (such as a series connection to form so-called strings) already at the time when they are produced.

What is claimed is:

1. Solar cell arrangement consisting of series-connected solar sub-cells each having an emitter and a base and produced from a semiconductor wafer forming a common base material for all solar sub-cells and where a number of recesses are provided for delimiting each solar sub-cell, characterized in that at least some of the recesses extend from the top surface of the semiconductor wafer to its bottom surface through the wafer itself and in continuation of the recesses as far as the wafer edge at most some bridge segments remain so as to mechanically interconnect the solar sub-cells.

2. Solar cell arrangement consisting of series-connected solar sub-cells according to claim 1, characterized in that at least one finger grid is available each for the emitter and the base.

3. Solar cell arrangement consisting of series-connected solar sub-cells according to claim 1, characterized in that on one side of the solar sub-cells one finger grid is provided each for the emitter and the base.

4. Solar cell arrangement consisting of series-connected solar sub-cells according to claim 3, characterized in that the respective finger grid is provided on the side opposite light.

5. Solar cell arrangement consisting of series-connected solar sub-cells according to claim 3, characterized in that the respective finger grid is provided on the side facing light.

6. Solar cell arrangement consisting of series-connected solar sub-cells according to claim 2, characterized in that, for connecting the emitters with the emitter finger grid, holes extending through the wafer and/or indentations on the wafer edge are provided where a material adequately conducting for contacting is placed.

7. Solar cell arrangement according to claim 1, characterized in that on the recesses extending from the top surface to the bottom surface of the semiconductor wafer an emitter of the solar sub-cells is provided which extends to the bottom of the cells.

8. Solar cell arrangement consisting of series-connected solar sub-cells according to claim 2, characterized in that on the finger grid for the emitter and the base a bus bar is provided disposed such that two adjacent solar sub-cells are electrically interconnected via a common bus bar.

9. Solar cell arrangement consisting of series-connected solar sub-cells according to claim 8, characterized in that the common solar sub-cell bus bar is disposed so as to pass over bridge segments.

10. Solar cell arrangement consisting of series-connected solar sub-cells according to claim 1, characterized in that between all adjacent solar-sub-cells of the wafer only the bridge segments remain.

11. Solar cell arrangement consisting of series-connected solar sub-cells according to claim 1, characterized in that in the area of the bridge segments an insulating oxide coating material firmly bonded with the semiconductor material of the wafer is provided forming and/or coating the bridge segments.

12. Solar cell arrangement consisting of series-connected solar sub-cells according to claim 11 and having a bus bar passing across the bridge segments for connecting the solar sub-cells, characterized in that the bus bar is a strip conductor extending on top of the insulating coating.

13. Solar cell arrangement consisting of series-connected solar sub-cells according to claim 1, characterized in that parts of a front or rear contact of a sub-cell extend through recesses in the semiconductor wafer and thus meet parts of a front or rear contact of an adjacent sub-cell so as to produce the series connection of the sub-cells.

14. Method for producing a solar cell arrangement consisting of series-connected solar sub-cells according to claim 1, characterized in that the recesses are produced by means of a wafer cutter, by using a laser, by means of wire cutting, etching methods, sandblasting, water torches, ultrasound treatment, or a combination thereof.

15. Method for producing a solar cell arrangement consisting of series-connected solar sub-cells according to claim 14, characterized in that the recesses are produced by means of a wafer cutter which is lowered stepwise to the wafer and moved across it.

16. Method for producing a solar cell arrangement consisting of series-connected solar sub-cells according to claim 15, characterized in that the wafer cutter is lowered at a first site to the wafer, moved across the wafer to where the bridge segment begins, moved with a lowering factor across the wafer at least once along a groove, and subsequently lowered further and moved again.

17. Method for producing a solar cell arrangement consisting of series-connected solar sub-cells according to claim 15 where a wafer cutter is lowered to the wafer, controlled and/or regulated while under rapid rotation, and moved through the wafer depth and then transversely across the wafer.

18. Solar cell arrangement module consisting of series-connected solar sub-cells made out of one semiconductor wafer, where, within the module, solar sub-cells having at least two varying areas are provided, and wherein wafer bridge segments are provided and are configured for contact with an external component unit.

19. Solar cell arrangement consisting of series-connected solar sub-cells according to claim 18 where the sub-cells disposed at an edge of the solar cell arrangement differ in area from the sub-cells disposed in a center of the solar cell arrangement.

20. Solar cell arrangement consisting of series-connected solar sub-cells according to claim 18 where the bridge segments are formed as part of a contact element mounted laterally before the wafer is cut.

21. Method for producing a solar cell arrangement consisting of series-connected solar sub-cells where solar sub-cells having at least two varying areas are provided and where the bridge segments are formed as part of a contact element mounted laterally before a semiconductor wafer is cut, characterized in that the wafer at its lateral wafer edge is first provided with a contact bank and thereafter is cut while leaving the bridge segments which are at least partially encompassed by the contact bank, and/or defining the bridge segments as bridge segments provided on the contact bank while completely severing the wafer material.

22. Contact bank for executing the method of claim 21, characterized in that metal bows are provided producing an electrical connection from a rear contact of a sub-cell to a front contact of another sub-cell and thus allowing a series connection of the sub-cells and containing recesses through which cutting tools can be guided.

23. Contact bank according to claim 22, characterized in that it includes a film coated with metal strips for forming strip conductors and/or that it includes a number of semiconductor wafers so as to interconnect a number of large-surfaced solar cells at the same time.

24. Method for producing a solar cell arrangement consisting of series-connected solar sub-cells where a semiconductor wafer is disposed on a carrier substrate and is subsequently provided with continuous cuts for producing and insulating the sub-cells, the carrier substrate being configured so as to provide for an external electrical series connection of the sub-cells is achieved at the time of cutting.

25. Method for producing a solar cell arrangement consisting of series-connected solar sub-cells according to claim 24, characterized in that the carrier substrate is first provided with strip conductors configured such that, in the completed solar sub-cell arrangement, base contacts on each solar sub-cell are connected with diagonally opposite rear emitter contacts of an adjacent solar sub-cell so as to produce the series connection.

26. Method for producing a solar cell arrangement consisting of series-connected solar sub-cells according to claim 24, characterized in that the carrier substrate is first provided with channels through which cutting tools can be guided for producing continuous recesses through the wafer without damaging the carrier substrate.

27. Method for producing a solar cell arrangement consisting of series-connected solar sub-cells according to claim 24 where the wafer is spaced apart from portions of the carrier substrate such that it lies slightly above the substrate in areas of separation so as to separate the wafer without damaging strip conductors extending on the carrier substrate below.

* * * * *